United States Patent
Young et al.

(10) Patent No.: US 10,680,764 B2
(45) Date of Patent: Jun. 9, 2020

(54) LOW-DENSITY PARITY CHECK (LDPC) PARITY BIT STORAGE FOR REDUNDANCY VERSIONS

(71) Applicant: QUALCOMM Incorporated, San Diego, CA (US)

(72) Inventors: Chi-Yuen Young, San Jose, CA (US); Jaeyoung Kwak, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 120 days.

(21) Appl. No.: 15/893,428

(22) Filed: Feb. 9, 2018

(65) Prior Publication Data

US 2019/0253199 A1    Aug. 15, 2019

(51) Int. Cl.
| | |
|---|---|
| H04L 1/18 | (2006.01) |
| H04L 1/00 | (2006.01) |
| H03M 13/00 | (2006.01) |
| H03M 13/11 | (2006.01) |

(52) U.S. Cl.
CPC ......... *H04L 1/1819* (2013.01); *H03M 13/116* (2013.01); *H03M 13/1188* (2013.01); *H03M 13/616* (2013.01); *H03M 13/618* (2013.01); *H03M 13/6306* (2013.01); *H03M 13/6502* (2013.01); *H04L 1/0041* (2013.01); *H04L 1/0057* (2013.01); *H04L 1/1874* (2013.01)

(58) Field of Classification Search
CPC ... H04L 1/1819; H04L 1/0041; H04L 1/0057; H04L 1/1874; H03M 13/116; H03M 13/1188; H03M 13/616; H03M 13/618; H03M 13/6306; H03M 13/6502

USPC ........ 714/776, 749, 751, 752, 786, 800, 821
See application file for complete search history.

(56) References Cited

U.S. PATENT DOCUMENTS

| | | | |
|---|---|---|---|
| 7,890,834 B2 | 2/2011 | Blankenship et al. | |
| 8,151,157 B2* | 4/2012 | Lee | H03M 13/116 |
| | | | 714/749 |
| 8,205,147 B2 | 6/2012 | Lin et al. | |
| 8,356,227 B2* | 1/2013 | Chung | H03M 13/116 |
| | | | 714/749 |
| 8,578,233 B2* | 11/2013 | Earnshaw | H04L 1/1812 |
| | | | 714/751 |

(Continued)

FOREIGN PATENT DOCUMENTS

| | | |
|---|---|---|
| WO | WO-2008124966 A1 | 10/2008 |
| WO | WO-2017131813 A1 | 8/2017 |

OTHER PUBLICATIONS

Divsalar et l., Protograph LDPC Codes with Node Degrees at Least 3, 2006, NASA, pp. 1-5. (Year: 2006).*

(Continued)

*Primary Examiner* — John J Tabone, Jr.
(74) *Attorney, Agent, or Firm* — Loza 7 Loza, LLP

(57) ABSTRACT

Aspects of the present disclosure relate to low density parity check (LDPC) encoding. At least a portion of the parity bits generated by an LDPC encoder for an initial transmission may be stored for use in generating subsequent hybrid automatic repeat request (HARQ) redundancy versions. In some examples, at least the degree-two and degree-three parity bits included in the initial transmission may be stored. The parity bits may be stored within a layer 2 (L2) or an upper layer buffer or within the LDPC encoder. For example, the parity bits may be stored within the HARQ buffer.

30 Claims, 12 Drawing Sheets

(56) References Cited

U.S. PATENT DOCUMENTS

| | | | |
|---|---|---|---|
| 8,892,979 | B2 | 11/2014 | Richardson et al. |
| 2005/0149841 | A1* | 7/2005 | Kyung ............... H03M 13/2957 714/800 |
| 2009/0249157 | A1* | 10/2009 | Lee ..................... H03M 13/116 714/749 |
| 2009/0313520 | A1* | 12/2009 | Chung ................. H03M 13/116 714/751 |
| 2010/0195571 | A1* | 8/2010 | Kuri ................... H03M 13/1102 370/328 |
| 2010/0287439 | A1* | 11/2010 | Papagiannis ......... H03M 13/118 714/752 |
| 2011/0276852 | A1* | 11/2011 | Mueller-Weinfurtner ................... H04L 1/1812 714/749 |
| 2016/0380724 | A1 | 12/2016 | Malladi et al. |
| 2017/0331497 | A1* | 11/2017 | Richardson ........ H03M 13/1174 |
| 2018/0159560 | A1* | 6/2018 | Sharon ................. G06F 3/0619 |
| 2019/0190543 | A1* | 6/2019 | Young ................. H03M 13/616 |

OTHER PUBLICATIONS

"3rd Generation Partnership Project; Technical Specification Group Radio Access Network; NR; Multiplexing and Channel Coding (Release 15)", 3GPP Standard, Technical Specification, 3GPP TS 38.212, 3RD Generation Partnership Project (3GPP), Mobile Competence Centre, 650, Route Des Lucioles, F-06921 Sophia-Antipolis Cedex, France, vol. RAN WG1, No. V1.2.1, Dec. 15, 2017 (Dec. 15, 2017), pp. 1-82, XP051392002, [retrieved on Dec. 15, 2017], p. 1, Section 5.3.2, Section 5.4.2.1.

Catt: "IR-HARQ Scheme for NR LDPC Codes", 3GPP Draft, R1-1712432 IR-HARQ Scheme for NR LDPC Codes, 3RD Generation Partnership Project (3GPP), Mobile Competence Centre, 650, Route Des Lucioles, F-06921 Sophia-Antipolis Cedex, France, vol. RAN WG1, No. Prague, Czechia, Aug. 21, 2017-Aug. 25, 2017, Aug. 20, 2017 (Aug. 20, 2017), XP051315248, 7 Pages, Retrieved from the Internet:URL:http://www.3gpp.org/ftp/Meetings_3GPP_SYNC/RAN1/Docs/ [retrieved on Aug. 20, 2017], pp. 1-2.

International Search Report and Written Opinion—PCT/US2019/017074—ISA/EPO—May 9, 2019.

Qualcomm Incorporated: "LDPC Rate Matching", 3GPP Draft, R1-1713462_LDPC_Rate_Matching, 3rd Generation Partnership Project (3GPP), Mobile Competence Centre, 650, Route Des Lucioles, F-06921 Sophia-Antipolis Cedex, France, vol. RAN WG1, No. Prague, Czech Republic, Aug. 21, 2017-Aug. 25, 2017, Aug. 20, 2017 (Aug. 20, 2017), XP051316263, 7 pages, Retrieved from the Internet :URL: http://www.3gpp.org/ftp/Meetings_3GPP_SYNC/RAN1/Docs/ [retrieved on Aug. 20, 2017], p. 2-p. 3.

* cited by examiner $$H = \begin{bmatrix} c_1 & c_2 & c_3 & c_4 & c_5 & c_6 & c_7 & c_8 & c_9 & c_{10} & c_{11} & c_{12} \\ 0 & 0 & 1 & 0 & 0 & 1 & 1 & 0 & 0 & 0 & 0 & 0 \\ 1 & 1 & 0 & 0 & 1 & 0 & 0 & 0 & 0 & 0 & 0 & 1 \\ 0 & 0 & 1 & 1 & 0 & 0 & 0 & 1 & 1 & 1 & 0 & 0 \\ 0 & 1 & 0 & 0 & 1 & 0 & 0 & 0 & 1 & 0 & 0 & 0 \\ 1 & 0 & 0 & 1 & 0 & 0 & 1 & 1 & 0 & 0 & 1 & 0 \\ 0 & 1 & 0 & 0 & 1 & 1 & 0 & 0 & 0 & 1 & 0 & 0 \\ 1 & 0 & 0 & 1 & 0 & 0 & 0 & 1 & 0 & 0 & 1 & 0 \\ 0 & 0 & 1 & 0 & 0 & 1 & 0 & 0 & 1 & 0 & 0 & 1 \\ 0 & 1 & 1 & 0 & 0 & 0 & 1 & 0 & 0 & 0 & 1 & 0 \\ 0 & 0 & 0 & 1 & 0 & 0 & 0 & 1 & 0 & 1 & 1 & 0 \end{bmatrix}$$

LOW-DENSITY PARITY CHECK (LDPC) PARITY BIT STORAGE FOR REDUNDANCY VERSIONS

TECHNICAL FIELD

The technology discussed below relates generally to wireless communication systems, and more particularly, to low-density parity check (LDPC) coding.

INTRODUCTION

Block codes, or error correcting codes are frequently used to provide reliable transmission of digital messages over noisy channels. In a typical block code, an information message or sequence is split up into blocks, and an encoder at the transmitting device then mathematically adds redundancy to the information message. Exploitation of this redundancy in the encoded information message is the key to reliability of the message, enabling correction for any bit errors that may occur due to noise. That is, a decoder at the receiving device can take advantage of the redundancy to reliably recover the information message even though bit errors may occur, in part, due to the addition of noise to the channel.

Many examples of such error correcting block codes are known to those of ordinary skill in the art, including Hamming codes, Bose-Chaudhuri-Hocquenghem (BCH) codes, turbo codes, and low-density parity check (LDPC) codes, among others. Many existing wireless communication networks utilize such block codes, such as 3GPP LTE networks, which utilize turbo codes; and IEEE 802.11n Wi-Fi networks, which utilize LDPC codes.

For future networks, such as fifth generation (5G) New Radio networks, LDPC codes may continue to be implemented to support a wide range of information block lengths and a wide range of code rates. In order to achieve a high throughput with efficient hardware utilization, additional enhancements of LDPC codes are desired.

BRIEF SUMMARY OF SOME EXAMPLES

The following presents a summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a form as a prelude to the more detailed description that is presented later.

Various aspects of the disclosure relate to the storage of parity bits generated in low-density parity check (LDPC) encoding. In some examples, at least the degree-two and degree-three parity bits included in the initial transmission may be stored for subsequent redundancy versions (RVs). In some examples, the parity bits may be stored within a layer 2 (L2) or an upper layer buffer or within the LDPC encoder. For example, the parity bits may be stored within a hybrid automatic repeat request (HARQ) buffer, which in some examples, may be within the LDPC encoder.

In one aspect of the disclosure, a method of low-density parity check (LDPC) encoding includes receiving an information block including information bits, encoding the information block using low-density parity check (LDPC) coding to produce an initial redundancy version including the information bits and a first set of parity bits, and transmitting the initial redundancy version. The method further includes storing at least a portion of the first set of parity bits as stored parity bits in a memory, receiving a request for retransmission associated with the information block, retrieving the stored parity bits from the memory, generating a subsequent redundancy version from the information bits and the stored parity bits, where the subsequent redundancy version comprises a second set of parity bits, and transmitting the subsequent redundancy version.

Another aspect of the disclosure provides an apparatus configured for low-density parity check (LDPC) encoding. The apparatus includes a memory a memory, a transceiver, and a processor communicatively coupled to the memory and the transceiver. The processor is configured to receive an information block including information bits, encode the information block using low-density parity check (LDPC) coding to produce an initial redundancy version including the information bits and a first set of parity bits, and transmit the initial redundancy version. The processor is further configured to store at least a portion of the first set of parity bits as stored parity bits in a memory, receive a request for retransmission associated with the information block, retrieve the stored parity bits from the memory, generate a subsequent redundancy version from the information bits and the stored parity bits, where the subsequent redundancy version comprises a second set of parity bits, and transmit the subsequent redundancy version.

Another aspect of the disclosure provides a wireless communication device configured for LDPC encoding. The wireless communication device includes means for receiving an information block including information bits, means for encoding the information block using low-density parity check (LDPC) coding to produce an initial redundancy version including the information bits and a first set of parity bits, and means for transmitting the initial redundancy version. The wireless communication device further includes means for storing at least a portion of the first set of parity bits as stored parity bits in a memory, means for receiving a request for retransmission associated with the information block, means for retrieving the stored parity bits from the memory, means for generating a subsequent redundancy version from the information bits and the stored parity bits, where the subsequent redundancy version comprises a second set of parity bits, and means for transmitting the subsequent redundancy version.

Another aspect of the disclosure provides a non-transitory computer-readable medium storing computer executable code. The non-transitory computer-readable medium includes code for receiving an information block including information bits, encoding the information block using low-density parity check (LDPC) coding to produce an initial redundancy version including the information bits and a first set of parity bits, and transmitting the initial redundancy version. The non-transitory computer-readable medium further includes code for storing at least a portion of the first set of parity bits as stored parity bits in a memory, receiving a request for retransmission associated with the information block, retrieving the stored parity bits from the memory, generating a subsequent redundancy version from the information bits and the stored parity bits, where the subsequent redundancy version comprises a second set of parity bits, and transmitting the subsequent redundancy version.

These and other aspects of the invention will become more fully understood upon a review of the detailed description, which follows. Other aspects, features, and embodiments of the present invention will become apparent to those of ordinary skill in the art, upon reviewing the following description of specific, exemplary embodiments of the present invention in conjunction with the accompanying figures. While features of the present invention may be discussed relative to certain embodiments and figures below, all embodiments of the present invention can include one or more of the advantageous features discussed herein. In other words, while one or more embodiments may be discussed as having certain advantageous features, one or more of such features may also be used in accordance with the various embodiments of the invention discussed herein. In similar fashion, while exemplary embodiments may be discussed below as device, system, or method embodiments it should be understood that such exemplary embodiments can be implemented in various devices, systems, and methods.

BRIEF DESCRIPTION OF THE DRAWINGS

FIG. 3 illustrates an example of a low-density parity check (LDPC) matrix according to some aspects of the present disclosure.

FIG. 6 illustrates a portion of an exemplary P-matrix according to some aspects of the present disclosure.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Figure 1:
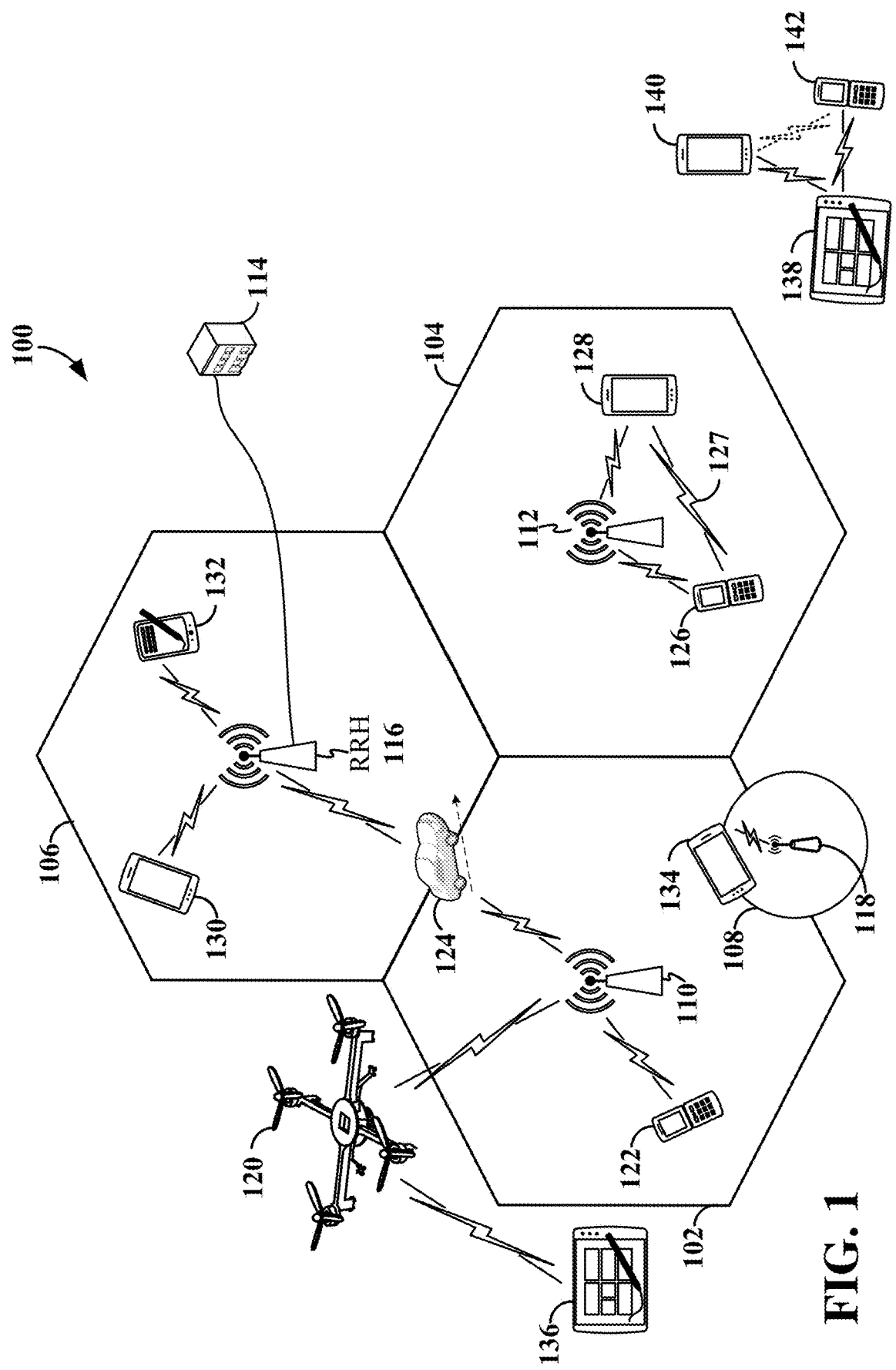
FIG. 1 is a diagram illustrating an example of a radio access network according to some aspects of the present disclosure.

The various concepts presented throughout this disclosure may be implemented across a broad variety of telecommunication systems, network architectures, and communication standards. Referring now to FIG. 1, as an illustrative example without limitation, a schematic illustration of a radio access network 100 is provided. In some examples, the radio access network 100 may be a network employing continued evolved wireless communication technologies. This may include, for example, a fifth generation (5G) or New Radio (NR) wireless communication technology based on a set of standards (e.g., issued by 3GPP, www.3gpp.org). For example, standards defined by the 3GPP following LTE-Advanced or by the 3GPP2 following CDMA2000 may be considered 5G. Standards may also include pre-3GPP efforts specified by Verizon Technical Forum and Korea Telecom SIG.

In other examples, the radio access network 100 may be a network employing a third generation (3G) wireless communication technology or a fourth generation (4G) wireless communication technology. For example, standards promulgated by the 3rd Generation Partnership Project (3GPP) and the 3rd Generation Partnership Project 2 (3GPP2) may be considered 3G or 4G, including but not limited to, Long-Term Evolution (LTE), LTE-Advanced, Evolved Packet System (EPS), and Universal Mobile Telecommunication System (UMTS). Additional examples of various radio access technologies based on one or more of the above-listed 3GPP standards include, but are not limited to, Universal Terrestrial Radio Access (UTRA), Evolved Universal Terrestrial Radio Access (eUTRA), General Packet Radio Service (GPRS) and Enhanced Data Rates for GSM Evolution (EDGE). Examples of such legacy standards defined by the 3rd Generation Partnership Project 2 (3GPP2) include, but are not limited to, CDMA2000 and Ultra Mobile Broadband (UMB). Other examples of standards employing 3G/4G wireless communication technology include the IEEE 802.16 (WiMAX) standard and other suitable standards.

While aspects and embodiments are described in this application by illustration to some examples, those skilled in the art will understand that additional implementations and use cases may come about in many different arrangements and scenarios. Innovations described herein may be implemented across many differing platform types, devices, systems, shapes, sizes, packaging arrangements. For example, embodiments and/or uses may come about via integrated chip embodiments and other non-module-component based devices (e.g., end-user devices, vehicles, communication devices, computing devices, industrial equipment, retail/purchasing devices, medical devices, AI-enabled devices, etc.). While some examples may or may not be specifically directed to use cases or applications, a wide assortment of applicability of described innovations may occur. Implementations may range a spectrum from chip-level or modular components to non-modular, non-chip-level implementations and further to aggregate, distributed, or OEM devices or systems incorporating one or more aspects of the described innovations. In some practical settings, devices incorporating described aspects and features may also necessarily include additional components and features for implementation and practice of claimed and described embodiments. For example, transmission and reception of wireless signals necessarily includes a number of components for analog and digital purposes (e.g., hardware components including antenna, RF-chains, power amplifiers, modulators, buffer, processor(s), interleaver, adders/summers, etc.). It is intended that innovations described herein may be practiced in a wide variety of devices, chip-level components, systems, distributed arrangements, end-user devices, etc. of varying sizes, shapes and constitution.

The geographic region covered by the radio access network 100 may be divided into a number of cellular regions (cells) that can be uniquely identified by a user equipment (UE) based on an identification broadcasted over a geographical area from one access point or base station. FIG. 1 illustrates macrocells 102, 104, and 106, and a small cell 108, each of which may include one or more sectors (not shown). A sector is a sub-area of a cell. All sectors within one cell are served by the same base station. A radio link within a sector can be identified by a single logical identification belonging to that sector. In a cell that is divided into sectors, the multiple sectors within a cell can be formed by groups of antennas with each antenna responsible for communication with UEs in a portion of the cell.

In general, a respective base station (BS) serves each cell. Broadly, a base station is a network element in a radio access network responsible for radio transmission and reception in one or more cells to or from a UE. A BS may also be referred to by those skilled in the art as a base transceiver station (BTS), a radio base station, a radio transceiver, a transceiver function, a basic service set (BSS), an extended service set (ESS), an access point (AP), a Node B (NB), an eNode B (eNB), a gNode B (gNB) or some other suitable terminology.

In FIG. 1, two base stations 110 and 112 are shown in cells 102 and 104; and a third base station 114 is shown controlling a remote radio head (RRH) 116 in cell 106. That is, a base station can have an integrated antenna or can be connected to an antenna or RRH by feeder cables. In the illustrated example, the cells 102, 104, and 106 may be referred to as macrocells, as the base stations 110, 112, and 114 support cells having a large size. Further, a base station 118 is shown in the small cell 108 (e.g., a microcell, picocell, femtocell, home base station, home Node B, home eNode B, etc.) which may overlap with one or more macrocells. In this example, the cell 108 may be referred to as a small cell, as the base station 118 supports a cell having a relatively small size. Cell sizing can be done according to system design as well as component constraints. It is to be understood that the radio access network 100 may include any number of wireless base stations and cells. Further, a relay node may be deployed to extend the size or coverage area of a given cell. The base stations 110, 112, 114, 118 provide wireless access points to a core network for any number of mobile apparatuses.

FIG. 1 further includes a quadcopter or drone 120, which may be configured to function as a base station. That is, in some examples, a cell may not necessarily be stationary, and the geographic area of the cell may move according to the location of a mobile base station such as the quadcopter 120.

In general, base stations may include a backhaul interface for communication with a backhaul portion (not shown) of the network. The backhaul may provide a link between a base station and a core network (not shown), and in some examples, the backhaul may provide interconnection between the respective base stations. The core network may be a part of a wireless communication system and may be independent of the radio access technology used in the radio access network. Various types of backhaul interfaces may be employed, such as a direct physical connection, a virtual network, or the like using any suitable transport network.

The radio access network 100 is illustrated supporting wireless communication for multiple mobile apparatuses. A mobile apparatus is commonly referred to as user equipment (UE) in standards and specifications promulgated by the 3rd Generation Partnership Project (3GPP), but may also be referred to by those skilled in the art as a mobile station (MS), a subscriber station, a mobile unit, a subscriber unit, a wireless unit, a remote unit, a mobile device, a wireless device, a wireless communications device, a remote device, a mobile subscriber station, an access terminal (AT), a mobile terminal, a wireless terminal, a remote terminal, a handset, a terminal, a user agent, a mobile client, a client, or some other suitable terminology. A UE may be an apparatus that provides a user with access to network services.

Within the present document, a "mobile" apparatus need not necessarily have a capability to move, and may be stationary. The term mobile apparatus or mobile device broadly refers to a diverse array of devices and technologies. For example, some non-limiting examples of a mobile apparatus include a mobile, a cellular (cell) phone, a smart phone, a session initiation protocol (SIP) phone, a laptop, a personal computer (PC), a notebook, a netbook, a smartbook, a tablet, a personal digital assistant (PDA), and a broad array of embedded systems, e.g., corresponding to an "Internet of things" (IoT). A mobile apparatus may additionally be an automotive or other transportation vehicle, a remote sensor or actuator, a robot or robotics device, a satellite radio, a global positioning system (GPS) device, an object tracking device, a drone, a multi-copter, a quadcopter, a remote control device, a consumer and/or wearable device, such as eyewear, a wearable camera, a virtual reality device, a smart watch, a health or fitness tracker, a digital audio player (e.g., MP3 player), a camera, a game console, a medical device, implantable devices, industrial equipment, and many other devices sized, shaped, and configured for use by users.

Within the radio access network 100, the cells may include UEs that may be in communication with one or more sectors of each cell. For example, UEs 122 and 124 may be in communication with base station 110; UEs 126 and 128 may be in communication with base station 112; UEs 130 and 132 may be in communication with base station 114 by way of RRH 116; UE 134 may be in communication with base station 118; and UE 136 may be in communication with mobile base station 120. Here, each base station 110, 112, 114, 118, and 120 may be configured to provide an access point to a core network (not shown) for all the UEs in the respective cells. UEs may comprise a number of hardware structural components sized, shaped, and arranged to help in communication; such components can include antennas, antenna arrays, RF chains, amplifiers, one or more processors, etc. electrically coupled to each other.

In another example, a mobile network node (e.g., quadcopter 120) may be configured to function as a UE. For example, the quadcopter 120 may operate within cell 102 by communicating with base station 110. In some aspects of the present disclosure, two or more UE (e.g., UEs 126 and 128) may communicate with each other using peer to peer (P2P) or sidelink signals 127 without relaying that communication through a base station (e.g., base station 112).

Unicast or broadcast transmissions of control information and/or traffic information (e.g., user data traffic) from a base station (e.g., base station 110) to one or more UEs (e.g., UEs 122 and 124) may be referred to as downlink (DL) transmission, while transmissions of control information and/or traffic information originating at a UE (e.g., UE 122) may be referred to as uplink (UL) transmissions. In addition, the uplink and/or downlink control information and/or traffic information may be time-divided into frames, subframes, slots, and/or symbols. As used herein, a symbol may refer to a unit of time that, in an orthogonal frequency division multiplexed (OFDM) waveform, carries one resource element (RE) per sub-carrier. A slot may carry 7 or 14 OFDM symbols. A subframe may refer to a duration of 1 ms. Multiple subframes or slots may be grouped together to form a single frame or radio frame. Of course, these definitions are not required, and any suitable scheme for organizing waveforms may be utilized, and various time divisions of the waveform may have any suitable duration.

The air interface in the radio access network 100 may utilize one or more multiplexing and multiple access algorithms to enable simultaneous communication of the various devices. For example, multiple access for uplink (UL) or reverse link transmissions from UEs 122 and 124 to base station 110 may be provided utilizing time division multiple access (TDMA), code division multiple access (CDMA), frequency division multiple access (FDMA), orthogonal frequency division multiple access (OFDMA), sparse code multiple access (SCMA), discrete Fourier transform spread orthogonal frequency division multiple access (DFT-s-OFDMA), resource spread multiple access (RSMA), or other suitable multiple access schemes. Further, multiplexing downlink (DL) or forward link transmissions from the base station 110 to UEs 122 and 124 may be provided utilizing time division multiplexing (TDM), code division multiplexing (CDM), frequency division multiplexing (FDM), orthogonal frequency division multiplexing (OFDM), sparse code multiplexing (SCM), discrete Fourier transform spread orthogonal frequency division multiplexing (DFT-s-OFDM) or other suitable multiplexing schemes.

Further, the air interface in the radio access network 100 may utilize one or more duplexing algorithms. Duplex refers to a point-to-point communication link where both endpoints can communicate with one another in both directions. Full duplex means both endpoints can simultaneously communicate with one another. Half duplex means only one endpoint can send information to the other at a time. In a wireless link, a full duplex channel generally relies on physical isolation of a transmitter and receiver, and suitable interference cancellation technologies. Full duplex emulation is frequently implemented for wireless links by utilizing frequency division duplex (FDD) or time division duplex (TDD). In FDD, transmissions in different directions operate at different carrier frequencies. In TDD, transmissions in different directions on a given channel are separated from one another using time division multiplexing. That is, at some times the channel is dedicated for transmissions in one direction, while at other times the channel is dedicated for transmissions in the other direction, where the direction may change very rapidly, e.g., several times per subframe.

In the radio access network 100, the ability for a UE to communicate while moving, independent of their location, is referred to as mobility. The various physical channels between the UE and the radio access network are generally set up, maintained, and released under the control of an access and mobility management function (AMF), which may include a security context management function (SCMF) that manages the security context for both the control plane and the user plane functionality and a security anchor function (SEAF) that performs authentication. In various aspects of the disclosure, a radio access network 100 may utilize DL-based mobility or UL-based mobility to enable mobility and handovers (i.e., the transfer of a UE's connection from one radio channel to another). In a network configured for DL-based mobility, during a call with a scheduling entity, or at any other time, a UE may monitor various parameters of the signal from its serving cell as well as various parameters of neighboring cells. Depending on the quality of these parameters, the UE may maintain communication with one or more of the neighboring cells. During this time, if the UE moves from one cell to another, or if signal quality from a neighboring cell exceeds that from the serving cell for a given amount of time, the UE may undertake a handoff or handover from the serving cell to the neighboring (target) cell. For example, UE 124 may move from the geographic area corresponding to its serving cell 102 to the geographic area corresponding to a neighbor cell 106. When the signal strength or quality from the neighbor cell 106 exceeds that of its serving cell 102 for a given amount of time, the UE 124 may transmit a reporting message to its serving base station 110 indicating this condition. In response, the UE 124 may receive a handover command, and the UE may undergo a handover to the cell 106.

In a network configured for UL-based mobility, UL reference signals from each UE may be utilized by the network to select a serving cell for each UE. In some examples, the base stations 110, 112, and 114/116 may broadcast unified synchronization signals (e.g., unified Primary Synchronization Signals (PSSs), unified Secondary Synchronization Signals (SSSs) and unified Physical Broadcast Channels (PBCH)). The UEs 122, 124, 126, 128, 130, and 132 may receive the unified synchronization signals, derive the carrier frequency and subframe/slot timing from the synchronization signals, and in response to deriving timing, transmit an uplink pilot or reference signal. The uplink pilot signal transmitted by a UE (e.g., UE 124) may be concurrently received by two or more cells (e.g., base stations 110 and 114/116) within the radio access network 100. Each of the cells may measure a strength of the pilot signal, and the radio access network (e.g., one or more of the base stations 110 and 114/116 and/or a central node within the core network) may determine a serving cell for the UE 124. As the UE 124 moves through the radio access network 100, the network may continue to monitor the uplink pilot signal transmitted by the UE 124. When the signal strength or quality of the pilot signal measured by a neighboring cell exceeds that of the signal strength or quality measured by the serving cell, the radio access network 100 may handover the UE 124 from the serving cell to the neighboring cell, with or without informing the UE 124.

Although the synchronization signal transmitted by the base stations 110, 112, and 114/116 may be unified, the synchronization signal may not identify a particular cell, but rather may identify a zone of multiple cells operating on the same frequency and/or with the same timing. The use of zones in 5G networks or other next generation communication networks enables the uplink-based mobility framework and improves the efficiency of both the UE and the network, since the number of mobility messages that need to be exchanged between the UE and the network may be reduced.

In various implementations, the air interface in the radio access network 100 may utilize licensed spectrum, unlicensed spectrum, or shared spectrum. Licensed spectrum provides for exclusive use of a portion of the spectrum, generally by virtue of a mobile network operator purchasing a license from a government regulatory body. Unlicensed spectrum provides for shared use of a portion of the spectrum without need for a government-granted license. While compliance with some technical rules is generally still required to access unlicensed spectrum, generally, any operator or device may gain access. Shared spectrum may fall between licensed and unlicensed spectrum, wherein technical rules or limitations may be required to access the spectrum, but the spectrum may still be shared by multiple operators and/or multiple RATs. For example, the holder of a license for a portion of licensed spectrum may provide licensed shared access (LSA) to share that spectrum with other parties, e.g., with suitable licensee-determined conditions to gain access.

In some examples, access to the air interface may be scheduled, wherein a scheduling entity (e.g., a base station) allocates resources (e.g., time-frequency resources) for communication among some or all devices and equipment within its service area or cell. Within the present disclosure, as discussed further below, the scheduling entity may be responsible for scheduling, assigning, reconfiguring, and releasing resources for one or more scheduled entities. That is, for scheduled communication, UEs or scheduled entities utilize resources allocated by the scheduling entity.

Base stations are not the only entities that may function as a scheduling entity. That is, in some examples, a UE may function as a scheduling entity, scheduling resources for one or more scheduled entities (e.g., one or more other UEs). In other examples, sidelink signals may be used between UEs without necessarily relying on scheduling or control information from a base station. For example, UE 138 is illustrated communicating with UEs 140 and 142. In some examples, the UE 138 is functioning as a scheduling entity or a primary sidelink device, and UEs 140 and 142 may function as a scheduled entity or a non-primary (e.g., secondary) sidelink device. In still another example, a UE may function as a scheduling entity in a device-to-device (D2D), peer-to-peer (P2P), or vehicle-to-vehicle (V2V) network, and/or in a mesh network. In a mesh network example, UEs 140 and 142 may optionally communicate directly with one another in addition to communicating with the scheduling entity 138.

Figure 2:
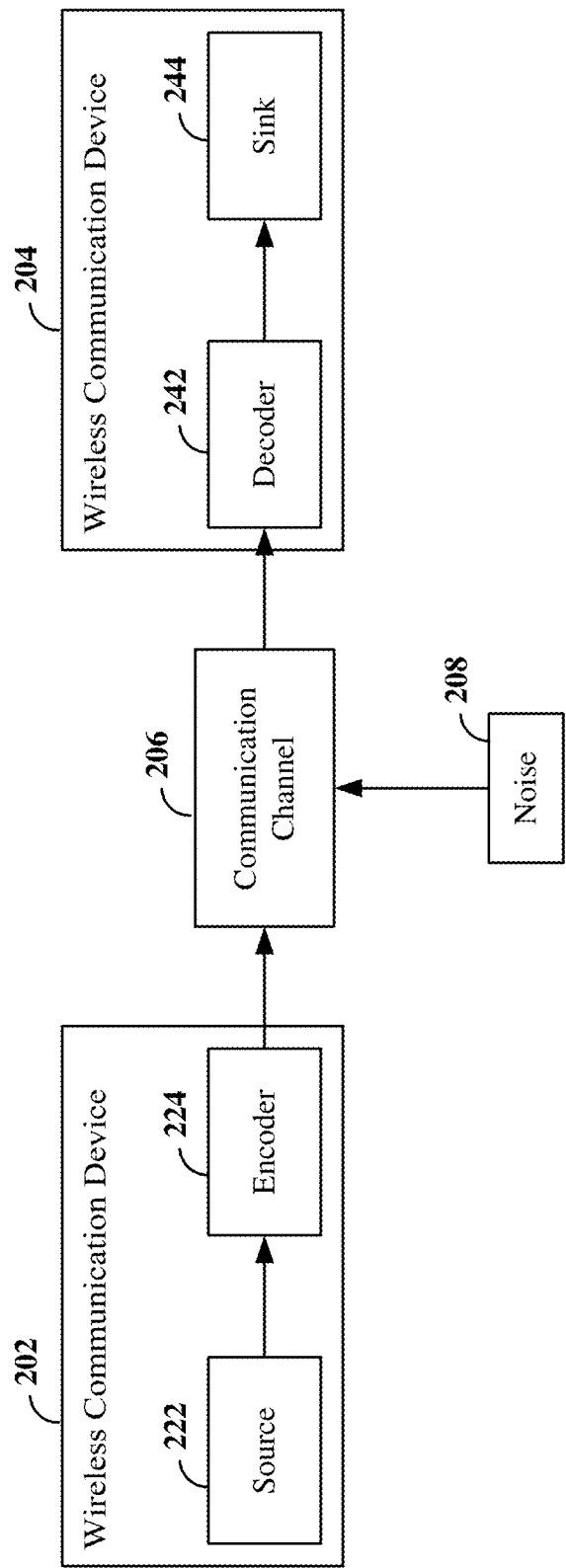
FIG. 2 is a schematic illustration of wireless communication utilizing block codes according to some aspects of the present disclosure.

FIG. 2 is a schematic illustration of wireless communication between a first wireless communication device 202 and a second wireless communication device 204. Each wireless communication device 202 and 204 may be a user equipment (UE), a base station, or any other suitable apparatus or means for wireless communication. In the illustrated example, a source 222 within the first wireless communication device 202 transmits a digital message over a communication channel 206 (e.g., a wireless channel) to a sink 244 in the second wireless communication device 204. To provide for reliable communication of the digital message, it is usually beneficial to take into account the noise 208 that affects the communication channel 206.

Block codes, or error correcting codes are frequently used to provide reliable transmission of digital messages over such channels. In a typical block code, an information message or sequence is split up into blocks, each block having a length of K bits. An encoder 224 at the first (transmitting) wireless communication device 202 then mathematically adds redundancy to the information message, resulting in codewords having a length of N, where N>K. Here, the code rate R is the ratio between the message length and the block length: i.e., R=K/N. Exploitation of this redundancy in the encoded information message is one key to reliability of the message, possibly enabling correction for bit errors that may occur due to the noise 208 or other signal propagation affects. That is, a decoder 242 at the second (receiving) wireless communication device 204 can take advantage of the redundancy to possibly recover the information message even though bit errors may occur, in part, due to the addition of noise to the channel, etc.

Many examples of such error correcting block codes are known to those of ordinary skill in the art, including Hamming codes, Bose-Chaudhuri-Hocquenghem (BCH) codes, turbo codes, and low-density parity check (LDPC) codes, among others. Many existing wireless communication networks utilize such block codes, such as 3GPP LTE networks, which utilize turbo codes; and IEEE 802.11n Wi-Fi networks, which utilize LDPC codes.

LDPC codes are linear forward error correcting codes, where each codeword of length N contains K information bits and C parity check bits (N=K+C). The symbols in an LDPC codeword satisfy C parity check equations of the form:

$$c_a \oplus c_b \oplus c_c \oplus \ldots \oplus c_z = 0,$$

where $c_a$, $c_b$, $c_c$, ... $c_z$ are the code bits in the parity check equation and $\oplus$ refers to modulo 2 addition (e.g., an exclusive or operation).

LDPC codes may be defined by a sparse parity-check matrix H. A parity-check matrix is a C-row by N-column binary matrix. The rows represent the parity check equations and the columns represent the bits in the codeword. There is a "one" in the i-th row and j-th column if the j-th code bit is contained in the i-th parity check equation. The parity-check matrix is sparse in that the matrix has a low density of ones. This sparsity renders low complexity decoding and leads to a simple implementation.

An example of a parity-check matrix H is shown in FIG. 3. In the example shown in FIG. 3, the length (N) of the codeword is twelve and the number of parity check bits (parity bits) (C) is nine. Therefore, the parity-check matrix H is a 12×9 matrix, with nine parity check equations and twelve bits. Each parity check equation is formed from the code bits $c_1$-$c_{12}$ corresponding to the nonzero locations in each row. For example, the first parity check equation corresponding to the first row may be represented as $c_3 \oplus c_6 \oplus 7 \oplus c_8 = 0$. Thus, the first parity check equation includes the code bits $c_3$, $c_6$, $c_7$, and $c_8$ in the codeword. Similar equations may be constructed for each of the other rows based on the nonzero elements in each row. The matrix H shown in FIG. 3 represents a regular LDPC code in that every code bit is contained in the same number of equations and each equation contains the same number of code bits. For example, in FIG. 3, each code bit $c_1$-$c_{12}$ is contained in three equations and each equation contains four code bits. In other examples, the LDPC code may be irregular, which includes a variable number of ones in the rows and columns.

Figure 4:
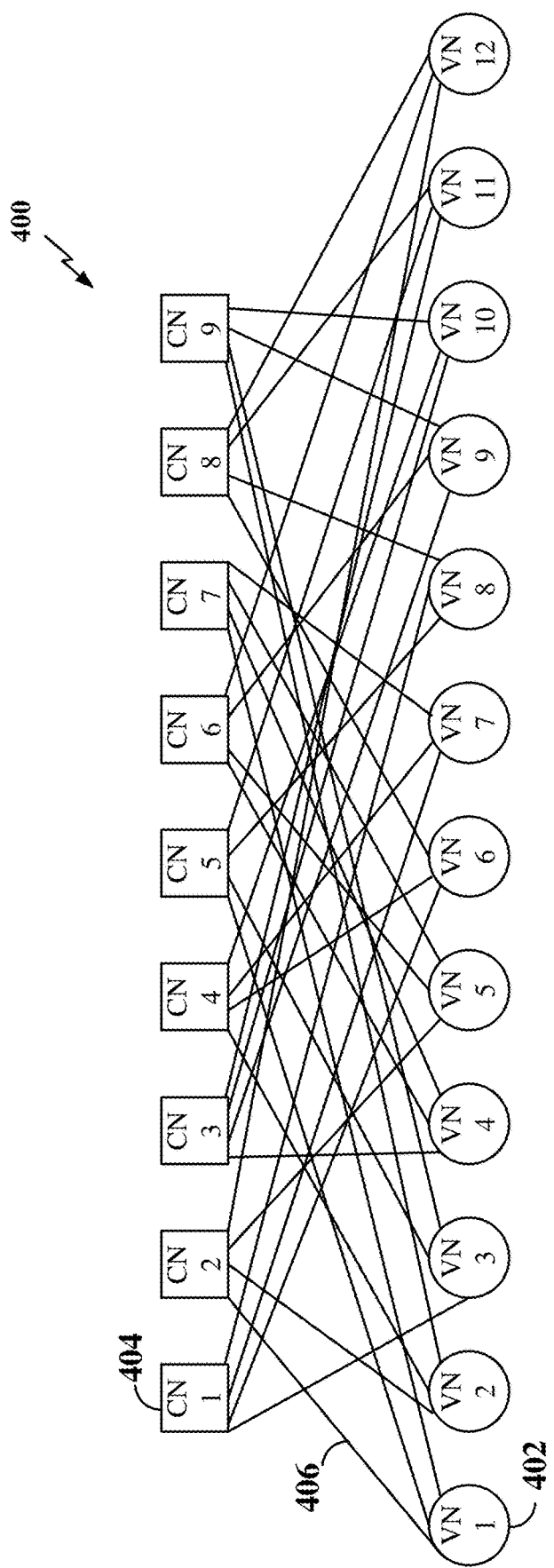
FIG. 4 illustrates an example of a LDPC base graph according to some aspects of the present disclosure.

Decoding of LDPC codes may best be understood by a graphical description. FIG. 4 illustrates an example of an LDPC graph 400 corresponding to the parity-check matrix H shown in FIG. 3. The graph 400 has two types of nodes: variable nodes (VN1-VN12) 402 and check nodes (CN1-CN9) 404. Each variable node represents a code bit and each check node represents a parity check equation. A line is drawn between a variable node and a check node if the code bit associated with the variable node is contained within the parity check equation associated with the check node. Each line may be referred to herein as an edge 406. Thus if a j-th variable node 402 is connected to an i-th check node 404 by an edge 406, i.e., the two nodes are neighbors, then there is a "1" in the i-th column and in the j-th row of the parity-check matrix H. That is, the intersection of an i-th row and a j-th column contains a "1" where an edge 406 joins the corresponding nodes 402 and 404 and a "0" where there is no edge. As such, each edge 406 corresponds to a non-zero element in the parity-check matrix.

The degree of a node refers to the number of edges connected to that node. This feature is illustrated in the H matrix shown in FIG. 4 where the number of edges incident to a variable node 402 is equal to the number of 1's in the corresponding column and is called the variable node degree d(v). Similarly, the number of edges connected with a check node 404 is equal to the number of ones in a corresponding row and is called the check node degree d(c). Since the graph shown in FIG. 4 corresponds to the parity-check matrix shown in FIG. 3, each variable node 402 has three edges 406 connecting it to check nodes 404 and each check node 404 has four edges 406 connecting it to variable nodes 402. A regular graph or code is one for which all variable nodes have the same degree, j, and all check nodes have the same degree, k. In this case, we say that the code is a (j, k) regular code. On the other hand, an irregular code has check nodes and/or variable nodes of differing degrees. For example, some variable nodes may be of degree 4, others of degree 3 and still others of degree 2.

A bit sequence associated one-to-one with the bit node sequence is a codeword of the code if and only if, for each check node 404, the bits neighboring the check node 404 (via their association with variable nodes 402) sum to zero modulo two, i.e., they comprise an even number of ones. In some cases, some of these bits might be punctured or known. Puncturing refers to the act of removing bits from a codeword to yield, in effect, a shorter codeword of a desired granularity. In the case of LDPC graphs, this means that some of the bit nodes 402 in the graph correspond to bits that are not actually transmitted. Puncturing a variable node 402 in an LDPC code creates a shortened code (e.g. due to the removal of a bit), while also effectively removing a check node 404. Specifically, for a matrix representation of an LDPC code, including bits to be punctured, where the variable node 402 to be punctured has a degree of one (such a representation may be possible through row combining provided the code is proper), puncturing the variable node 402 removes the associated bit from the code and effectively removes its single neighboring check node 404 from the graph. As a result, the number of check nodes 404 in the graph is reduced by one.

The LDPC decoder and decoding algorithm used to decode LDPC codewords operate by exchanging messages within the graph 400 along the edges 406 and updating these messages by performing computations at the nodes 402 and 404 based on the incoming messages. Each variable node 402 in the graph 400 is initially provided with a soft bit that indicates an estimate of the probability that the bit is a one, as determined by observations from, e.g., the communications channel (e.g., the channel estimate). The variable node 402 broadcasts this soft bit (initial estimate) to the check nodes 404 on the edges 406 connected to that variable node 402. Each check node 404, in turn, generates first new estimates for the bits involved in that parity check equation and sends back these first new estimates on the edges 406 back to the variable nodes 402. The first new estimates are calculated based upon all of the initial estimates furnished to the parity node.

For example, consider the first check node CN1 corresponding to the equation $c_3 \oplus c_6 \oplus c_7 \oplus c_8 = 0$. This check node may receive initial estimates $e_3$, $e_6$, $e_7$, and $e_8$ from the variable nodes VN3, VN6, VN7, and VN8 corresponding to the code bits $c_3$, $c_6$, $c_7$, and $c_8$. The first new estimate for the variable node VN3 corresponding to code bit $c_3$ may then be calculated as:

$$e'_3 = e_6(1-e_7)(1-e_8) + e_7(1-e_6)(1-e_8) + e_8(1-e_6)(1-e_7) + e_6 e_7 e_8.$$

Similar calculations may be made for the new estimates for the remaining variable nodes.

As a result, each variable node 402 is provided different first new estimates by each of the check nodes 404 connected to it. Each variable node 402 may then determine a respective second new estimate for each of the check nodes 404 connected to it based on the original channel estimate together with a combination of the first new estimates received from each check node (except the check node to which the additional new estimate is sent). Thus, in determining the second new estimate sent from the variable node 402 to a check node 404, the variable node 402 ignores the first new estimate received from that check node 404. For example, variable node VN3 will ignore the first new estimate sent from check node CN1 when determining the second new estimate for check node CN1. The second new estimate for a particular check node may then be calculated, for example, as a normalized product of the first new estimates received from the other check nodes 404, taking into consideration the original channel estimate. This process repeats with check nodes 404 passing edge messages (estimates) to variable nodes 402 and variable nodes 402 passing edge messages (estimates) to check nodes 404 until a final estimate is computed at each variable node 402 by computing the normalized product of all of the estimates. A hard decision on each bit may then be made by comparing the final estimate with a threshold (e.g., 0.5).

In some examples, the graph 400 shown in FIG. 4 may be considered a base graph. As used herein, the term "base graph" refers to an LDPC graph having dimensions less than that necessary to produce the minimum codeword length utilized in a wireless communication network (e.g., the radio access network 100 shown in FIG. 1). To produce an LDPC graph corresponding to a desired information block length K and code rate R, each of the elements in the LDPC parity-check matrix representing the LDPC graph may be lifted (e.g., replaced with another matrix) by a lift size Z (e.g., $K_b * Z = K$). For example, if the base graph is represented by a 3×3 matrix and a lift size Z of three is applied to the base graph, the resulting lifted parity-check matrix is a 9×9 matrix to support a codeword having nine code bits (e.g., where each column in the matrix is associated with a set of three of the code bits). In effect, lifting is a technique for generating a relatively large LDPC code from multiple copies of a smaller base code. The largest lift size $Z_{max}$ represents the largest degree of parallelism that may be achieved per edge in the base graph, corresponding to the largest information block length $K_{max}$.

In some examples, construction of the lifted parity-check matrix may involve replacing each of the elements of the base parity-check matrix with a square submatrix of size Z×Z (the lift size), where each submatrix is either a cyclic-permutation of the identity matrix or a null submatrix. For example, for a submatrix size of 3×3, corresponding to a lift size of three, the submatrix $P_o$ may be the identity matrix and other submatrices $P_i$ may be obtained by cyclically-shifting the columns to the right by i elements.

Each element in the base parity-check matrix may then contain an identity of the lifted submatrix (e.g., $P_i$ or *, where * indicates a null matrix). If an element includes a lifted submatrix identity, then the set of bits associated with the column containing the element are cyclically shifted (rotated) by an amount corresponding to the submatrix identity. Using the above example of a lift size of three, there are three bits associated with each column, and if a particular element in a column contains $P_2$, the bits associated with that column would be shifted to the right by two bit positions.

For example, the code bits [0 1 0] would be shifted to [1 0 0]. In some examples, the base parity-check matrix may support a maximum of twenty-two information bits (also referred to herein as systematic bits) with a maximum lift size of three-hundred eighty-four.

Figure 5:
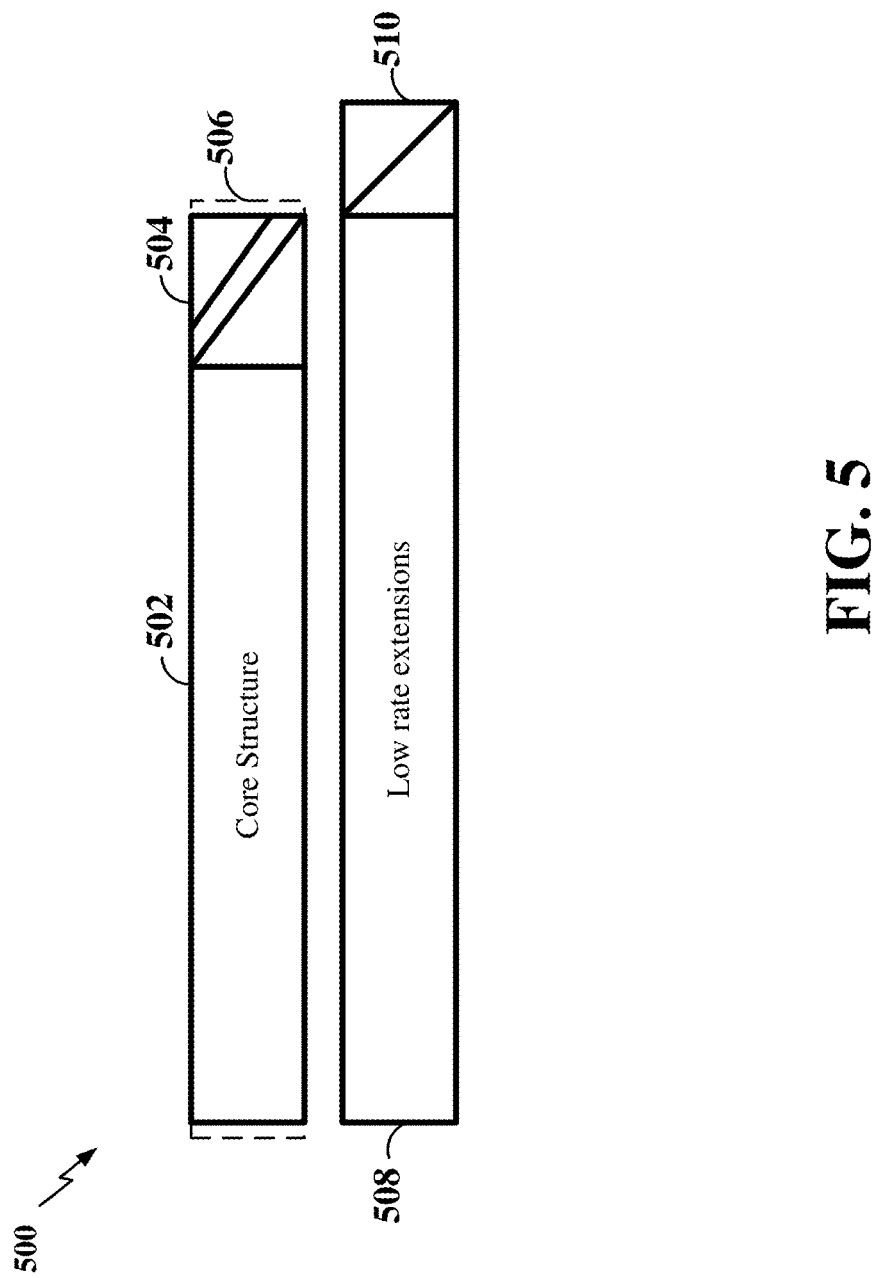
FIG. 5 illustrates a general structure of an exemplary base parity check matrix (P-matrix) according to some aspects of the present disclosure.

FIG. 5 shows a general structure 500 of an exemplary base parity-check matrix (P-matrix) that may be utilized for both LDPC encoding and LDPC decoding (e.g., together with a corresponding LDPC base graph). The exemplary base P-matrix includes a core structure 502 with degree-three or higher variable nodes that forms the set of information (systematic) bit-columns. The P-matrix structure 500 further includes a parity structure 504, which includes an accumulated chain of degree-two parity bits. Alternate coding structures may be used, for example to support deeper error floors, and the disclosed techniques may be applied to such variations on the coding structure.

The portion of the P-matrix structure 500 including the core structure 502 and parity structure 504 may be referred to herein as a core graph 506. The core graph 506 has an associated code rate determined by its parameters. In some cases, some of the parity bits in the core graph 506 might be punctured to support coding rates above the rate of the core graph 506.

FIG. 5 also depicts low-rate extensions 508 and additional degree-one parity bits 510. While optional, the low-rate extensions 508 and degree-one parity bits 510 may extend the P-matrix for further incremental redundancy hybrid automatic repeat request (IR-HARQ) transmissions or, in general, for defining codes of lower rate than the rate associated with the core graph 506. The complete graph or some portion beyond the core graph may be referred to as an extended graph.

Figure 6:
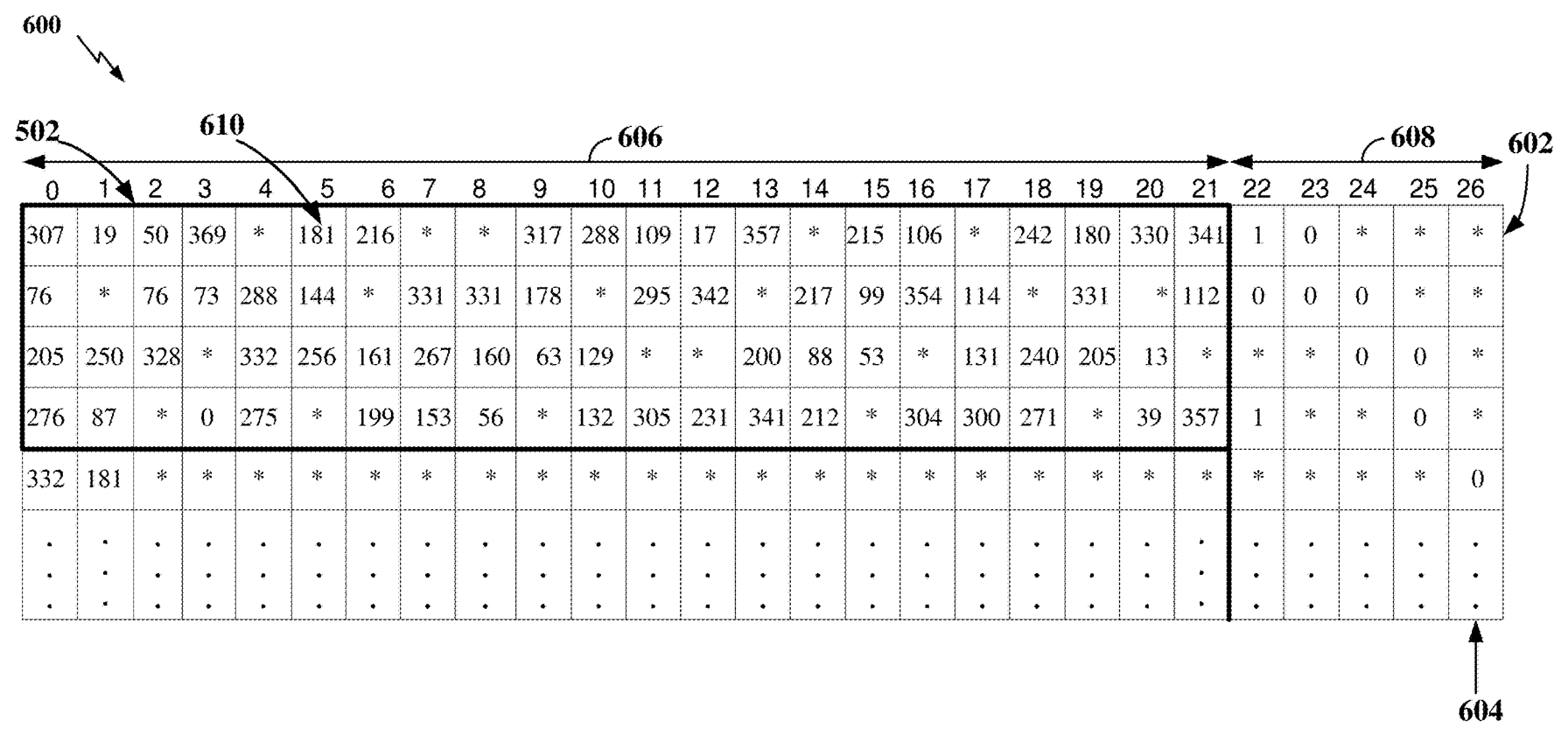

FIG. 6 illustrates a portion of an exemplary P-matrix 600 according to some aspects of the present disclosure. The P-matrix 600 includes a plurality of rows 602 and columns 604. Each of the rows 602 represents a parity check equation, while each of the columns 604 represents a set of bits, where each set of bits may include a number of bits corresponding to the lift size. The columns 604 may be divided into information bit columns 606 and parity bit columns 608. The information bit columns 606 correspond to the information (systematic) bits, while the parity bit columns 608 correspond to the parity bits.

In the example shown in FIG. 6, twenty-seven columns (columns 0-26) are illustrated. However, it should be understood that this may represent only a portion of the number of columns in the P-matrix 600. In addition, in the example shown in FIG. 6, there are twenty-two information bit columns 606, with the first four rows 602 of information bit columns 606 corresponding to the core structure 502 shown in FIG. 5. However, the number of information bit columns 606 may vary, depending on the encoding structure utilized. The remaining rows 602 below the core structure 502 may correspond to the low rate extensions 508 shown in FIG. 5, which may include any number of additional rows 602.

The first parity bit column (column 22) corresponds to a set of degree-three parity bits, while the second, third, and fourth parity columns (columns 23-25) correspond to respective sets of degree-two parity bits. Thus, in some examples, columns 22-25 may correspond to the parity structure 504 shown in FIG. 5. The degree-one parity bits corresponding to the parity bit extension 510 shown in FIG. 5 may begin in column 26.

Each element 610 of the P-matrix 600 contains an identity of the lifted submatrix (e.g., $P_i$, or *, where * indicates a null matrix and i=0 Z). In FIG. 6, only the subscript i is shown in each element 610, for simplicity. If an element 610 includes a lifted submatrix identity, then the set of bits associated with the column containing the element are cyclically shifted (rotated) by an amount corresponding to the submatrix identity. For example, the element 610 in the first row 602 and sixth column 604 contains the submatrix identity of 181 ($P_{181}$). Thus, for this element 610, the set of bits associated with the sixth column are rotated (shifted) by 181 bit positions within the set of bits. For example, each bit within the set of bits associated with the sixth column may be shifted to the right by 181 bit positions and wrapping around to the left-most bit position. Thus, the submatrix identity within each element 610 of the P-matrix 600 indicates a degree of rotation of the respective set of the bits corresponding to the column 604 containing the element 610.

For LDPC encoding, the rotated set of bits from each of the rows within the core structure 502 may be utilized to determine each of the degree-three and degree-two parity bits associated with columns 22-25 based on back substitution. For example, the parity bits corresponding to column 22 may represent a first set of parity bits ($p_0$), the parity bits corresponding to column 23 may represent a second set of parity bits ($p_1$), the parity bits corresponding to column 24 may represent a third set of parity bits ($p_2$), and the parity bits corresponding to column 25 may represent a fourth set of parity bits ($p_3$).

Each of the rows 602 in the P-matrix indicates a parity-check equation in which the modulo-2 addition (e.g., XOR) of each of the elements in a row equals zero. For example, the parity check equations for each of the first four rows may be as follows:

$$P_{307}s_0 \oplus P_{19}s_1 \oplus \ldots \oplus P_{341}s_{21} \oplus P_1p_0 \oplus P_0p_1=0$$

$$P_{76}s_0 \oplus P_{76}s_3 \oplus \ldots \oplus P_{112}s_{21} \oplus P_0p_0 \oplus P_0p_1 \oplus P_0p_2=0$$

$$P_{205}s_0 \oplus P_{250}s_1 \oplus \ldots \oplus P_{13}s_{20} \oplus P_0p_2 \oplus P_0p_3=0$$

$$P_{276}s_0 \oplus P_{87}s_1 \oplus \ldots \oplus P_{357}s_{21} \oplus P_1p_0 \oplus P_0 \oplus P_0p_3=0,$$

where $P_i s_j$ indicates modulo-2 addition (XOR) of the set of bits ($s_j$) corresponding to the j-th column with the cyclic-permutation of the identity matrix indicated by the submatrix identity $P_i$, indicated in an element 610 of the j-th column.

Since each parity check equation equals zero, the parity check equations may also be equal to one another. Therefore, redundant elements in each equation may be canceled, thus leaving $P_0p_0$ (which is equal to $p_0$) in the parity-check equation corresponding to the second row that may be solved for. Once $p_0$ is calculated (e.g., by multiplying (XORing) each of the rotated set of bits in the third row), $p_0$ may be utilized to calculate the remaining degree-two parity bits $p_1$-$p_3$. For example, $p_0$ may be rotated by $P_1$ and then the rotated set of bits $P_1p_0$ may be multiplied (XORed) with the respective rotated sets of bits in each of the first and fourth rows to obtain the respective sets of parity bits for $p_1$ and $p_3$. The remaining set of parity bits $p_2$ may then be obtained by multiplying (XORing) the set of parity bits $p_3$ with the rotated sets of bits in the second row of the P-matrix. The degree-three parity bits and degree-two parity bits may then be utilized to calculate the degree-one parity bits, as indicated in the remainder of the P-matrix (not shown).

The parity bits calculated using the P-matrix 600 may then be concatenated with the information bits to produce an encoded packet (codeword) that may then be transmitted to a receiver. The receiver may utilize the parity check equations indicated by the P-matrix 600 to determine whether the codeword has been correctly received. For example, the receiver may XOR each of the rotated sets of bits (including any parity bits or rotated sets of parity bits) in each row and determine whether the computed result for each is equal to zero. If the results produced by the parity check equations indicated in the P-matrix are not equal to zero, the receiver may determine that the codeword has not been correctly received.

If the receiver is not able to properly decode the codeword, a hybrid automatic repeat request (HARQ) scheme may be utilized to further improve data reliability. In a HARQ algorithm, the transmitting wireless communication device may retransmit redundancy versions of coded information blocks (e.g., encoded using LDPC) if the first (initial) transmission is not decoded correctly at the receiving wireless communication device. In general, if the received codeword is properly decoded, then the receiving device may transmit an acknowledgment (ACK), informing the transmitting device that a retransmission is not needed. However, if the received codeword is not properly decoded, then the receiving device may transmit a negative acknowledgment (NACK) requesting a retransmission. A limited number of retransmissions may be made before the transmission attempt is terminated.

There are two main types or categories of HARQ algorithms: chase-combining HARQ (HARQ-CC) and incremental redundancy HARQ (HARQ-IR). In HARQ-CC, a retransmitted codeword is identical to the original transmission of the codeword. That is, if a codeword is not decoded properly at the receiving device, resulting in a NACK, then the transmitting device may retransmit the full codeword including identical information to the original transmission. The information may then ideally be obtained error-free by virtue of a process called soft combining, where the redundant bits from the retransmission may be combined before decoding to increase the probability of correct reception of each bit.

On the other hand, in HARQ-IR, the retransmission may be different from the originally transmission, and further, if multiple retransmissions are made, each retransmission may differ from one another. Here, retransmissions may include different sets of coded bits: for example, corresponding to different sets parity bits. As with HARQ-CC, here, the information may be obtained error-free by utilizing soft combining to combine the retransmitted bits with the original transmitted bits.

Each HARQ-IR transmission is typically referred to as a redundancy version, with the initial transmission of a packet being denoted RV0 (e.g., the initial redundancy version). The first IR retransmission of the packet may be referred to as RV1, the second IR retransmission of the packet may be referred to as RV2, and so on, up to RVN, corresponding to the maximum number of retransmissions allowed before the packet is considered lost.

Figure 7:
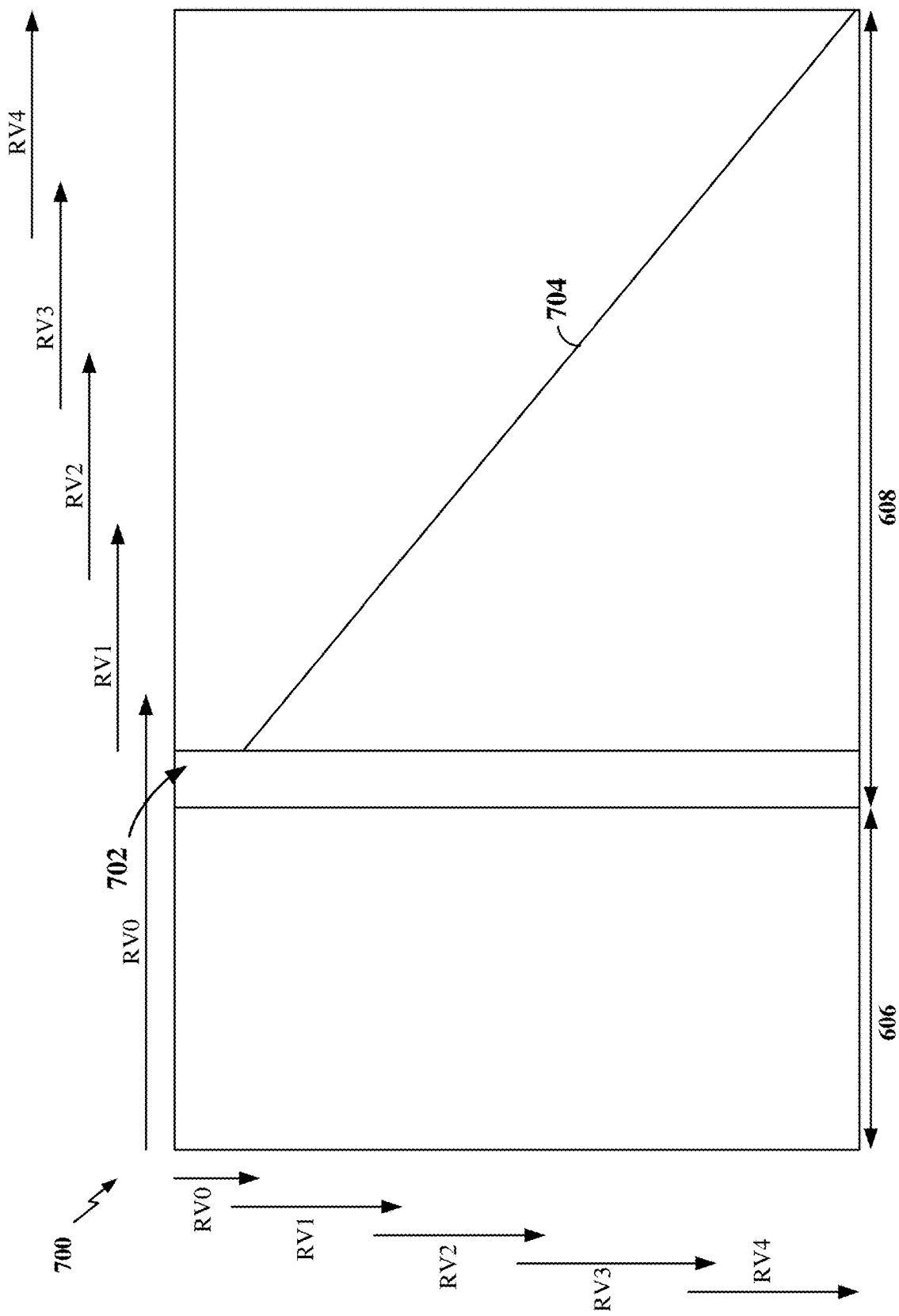
FIG. 7 is a diagram illustrating an exemplary P-matrix that may be utilized for incremental redundancy hybrid automatic repeat request (IR-HARQ) according to some aspects of the present disclosure.

FIG. 7 is a diagram illustrating a P-matrix 700 that may be utilized for IR-HARQ according to some aspects of the present disclosure. The P-matrix 700 may, in some examples, be similar to the P-matrix shown in FIG. 6, in that the P-matrix 700 incudes a plurality of rows and columns, where each of the rows represents a parity check equation and each of the columns represents a set of bits and each set of bits may include a number of bits corresponding to the lift size. As in the example shown in FIG. 6, the columns may be divided into information bit columns 606 and parity bit columns 608. The information bit columns 606 correspond to the information (systematic) bits, while the parity bit columns 608 correspond to the parity bits.

The parity bit columns 608 may further be divided into degree-two or higher parity bit columns 702 and degree-one parity bit columns 704. In some examples, the degree-two or higher parity bit columns 702 may correspond to columns 22-25 shown in FIG. 6 and/or the parity structure 504 shown in FIG. 5. The degree-one parity bit columns 704 may correspond to columns 26 and up in FIG. 6 and/or the degree-one parity bits 510 shown in FIG. 5. In some examples, the degree-one parity bits 704 may be utilized for IR-HARQ transmissions.

For example, an initial/first transmission (RV0) generated using the P-matrix 700 may include at least the information bits corresponding to the information bit columns 606 and the degree-two or higher parity bits corresponding to the degree-two or higher parity bit columns 702. In the example shown in FIG. 7, the initial transmission (RV0) may further include degree-one parity bits corresponding to an initial portion of the degree-one parity bits columns 704.

If the initial transmission is not correctly received and a retransmission is requested, a first IR retransmission (RV1) may be generated that includes at least degree-one parity bits corresponding to a first portion of the degree-one parity bit columns 704. In the example shown in FIG. 7, the first portion of the degree-one parity bit columns 704 includes the initial portion of the degree-one parity bit columns 704 and additional degree-one parity bit columns 704. Thus, RV1 may include the degree-one parity bits included in RV0, plus additional degree-one parity bits that may be generated based on the parity check equations in lower rows of the P-matrix 700. In the example shown in FIG. 7, RV1 does not include the degree-two or higher parity bits corresponding to the degree-two or higher parity bit columns 702. However, in other examples, RV1 may include a portion of the degree-two or higher parity bits. In addition, in other examples, RV1 may not include any of the degree-one parity bits included in RV0 (e.g., there may be no overlap between RV0 and RV1). In addition, RV1 may include some or all of the information bits or none of the information bits. It should be understood that the illustration in FIG. 7 is merely exemplary, and other configurations of RVs may be utilized in various aspects of the disclosure.

If the first transmission is not correctly received and another retransmission is requested, a second RV transmission (RV2) may be generated that includes at least degree-one parity bits corresponding to a second portion of the degree-one parity bit columns 704. In the example shown in FIG. 7, the second portion of the degree-one parity bit columns 704 includes the a subset of the first portion of the degree-one parity bit columns 704 and additional degree-one parity bit columns 704. Thus, RV2 may include a subset of the degree-one parity bits included in RV1, plus additional degree-one parity bits not included in RV0 or RV1 that may be generated based on the parity check equations in lower rows of the P-matrix 700. In the example shown in FIG. 7, RV2 also does not include the degree-two or higher parity bits corresponding to the degree-two or higher parity bit columns 702. However, in other examples, RV2 may include a portion of the degree-two or higher parity bits. Further redundancy versions (e.g., RV3 and RV4) may also be generated in a similar fashion, as shown in FIG. 7. It should be understood that the order of RVs shown in FIG. 7 is merely exemplary, and in other examples, the RV may not be requested in a natural order (e.g., any number of RVs may be requested in one retransmission and the RVs may be requested in any order).

To facilitate IR-HARQ with LDPC coding, the information bits may be stored by the transmitting wireless communication device until the information bits are no longer needed for retransmission. However, for each retransmission, new degree-one parity bits may need to be generated. Since the degree-one parity bits may be calculated based on both the information bits and the degree-two or higher parity bits, together with the rotations indicated by the P-matrix 700, as described above in reference to FIG. 6, for each retransmission, the degree-two or higher parity bits may also need to be re-generated, thus increasing the cycle count for each retransmission.

However, it is not hardware or latency efficient to generate all parity bits that may be utilized for subsequent redundancy versions in advance and then store all of the generated parity bits. Therefore, in various aspects of the disclosure, at least a portion of the parity bits generated for the initial transmission (RV0) may be stored to reduce the latency in generating additional parity bits for subsequent redundancy versions. In some examples, the degree-two and/or degree-three parity bits may be stored.

Figure 8:
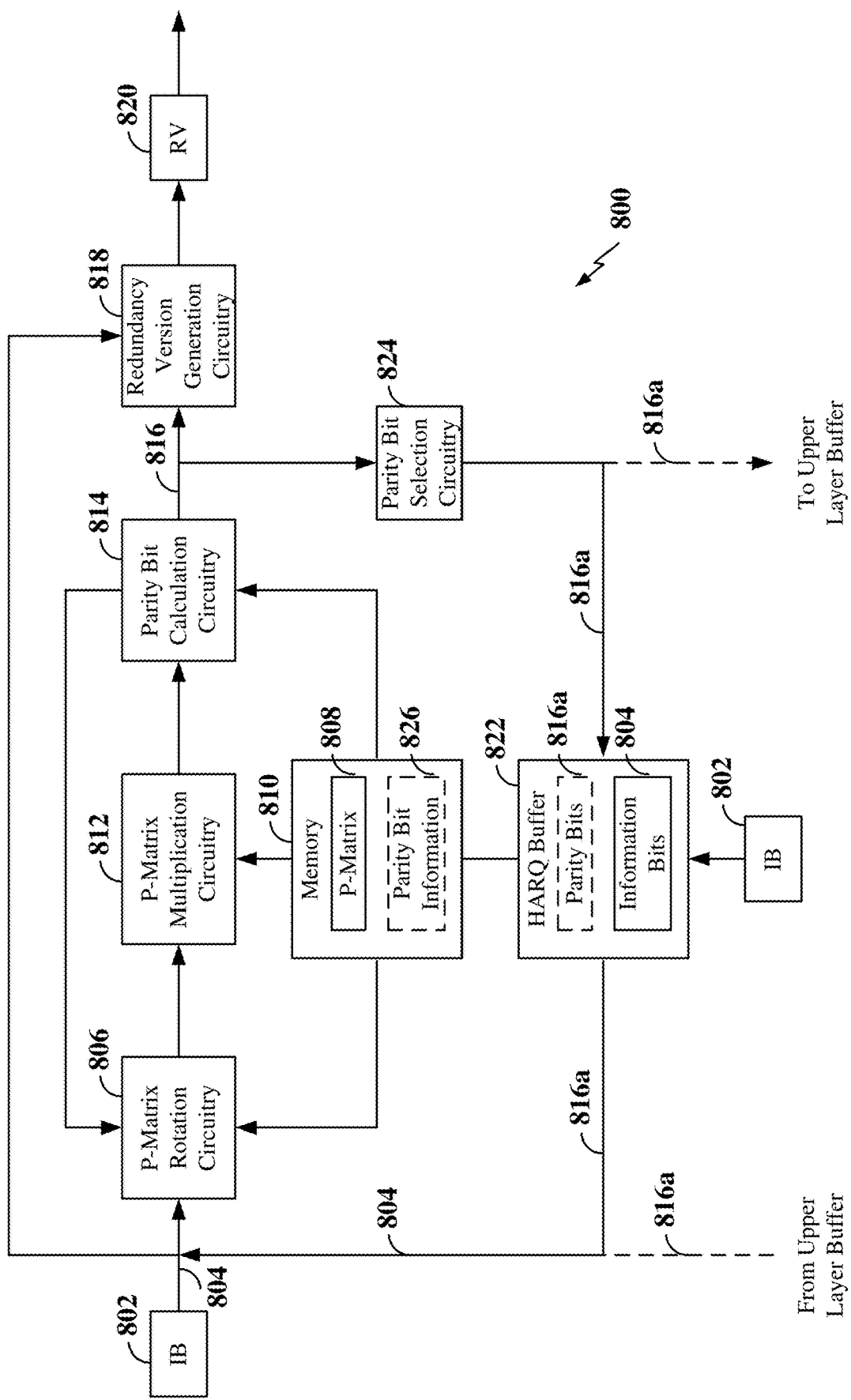
FIG. 8 is a diagram illustrating LDPC encoding circuitry according to some aspects of the present disclosure.

FIG. 8 is a diagram illustrating LDPC encoding circuitry 800 for generating one or more redundancy versions and storing at least a portion of the parity bits generated for the initial redundancy version (RV0) according to some aspects of the present disclosure. For an initial transmission (RV0), the LDPC encoding circuitry 800 may be configured to receive an information block (IB) 802 including a plurality of information bits 804 to be encoded. The LDPC encoding circuitry 800 may input the IB 802 to P-matrix rotation circuitry 806 configured to divide the information bits 804 into sets of information bits based on the lift size such that each set of information bits corresponds to a column in a selected P-matrix 808. It should be understood that the LDPC encoding circuitry 800 may be configured with multiple P-matrices (each of which may be stored within a memory 810) and the LDPC encoding circuitry 800 may select a particular P-matrix 808 for use in encoding the IB 802.

The P-matrix rotation circuitry 806 may further be configured to rotate each set of bits by the respective amounts indicated in each element of each row of the P-matrix 808 to produce a plurality of rotated sets of bits. The LDPC encoding circuitry 800 may further include P-matrix multiplication circuitry 812 configured to multiply (XOR) the rotated sets of bits within each row and to provide the results to parity bit calculation circuitry 814 to calculate the parity bits associated with each parity bit column of the P-matrix included in the initial transmission. For example, the degree-two and/or degree-three parity bits may be calculated using back substituted, as described above.

To implement back substitution and calculation of the degree-one parity bits, the degree-two and/or degree-three parity bits may be fed back to the P-matrix rotation circuitry 806 for rotation of the degree-three and/or degree-two parity bits as indicated in the P-matrix 808. The rotated degree-three and/or degree-two parity bits may be then be input to the P-matrix multiplication circuitry 812 for multiplication of the rotated degree-three and/or degree-two parity bits with the other rotated sets of bits in each row. The degree-one parity bits may be calculated by the parity bit calculation circuitry 814 directly from the results produced by the P-matrix multiplication circuitry 812. For example, each set of degree-one parity bits may be equal to the multiplication (XOR) of each rotated set of bits in the P-matrix row containing the set of degree-one parity bits.

The output of the parity bit calculation circuitry 814 may thus include a set of parity bits 816 for an initial transmission (RV0) of the IB 802. The parity bits 816 and the original information bits 804 of the information block 802 may be input to redundancy version generation circuitry 818 for generation of a redundancy version 820. For example, the redundancy version generation circuitry 818 may concatenate the information bits 804 and the parity bits 816 to produce an initial redundancy version 820.

To implement hybrid automatic repeat request (HARQ) and facilitate further incremental redundancy versions, the information bits 804 in the information block 802 may be stored in a HARQ buffer 822. The HARQ buffer 822 may be within the LDPC encoder 800, as shown in FIG. 8, or external to the LDPC encoder 800. In addition, in various aspects of the disclosure, the initial (first) set of parity bits 816 generated for the initial redundancy version RV0 may be input to parity bit selection circuitry 824 to select at least a portion of the initial set of parity bits 816a to store for subsequent redundancy versions. In some examples, the stored parity bits 816a may include at least the degree-two and/or degree-three parity bits. Using the example shown in FIG. 7, the stored parity bits 816a may include the parity bits associated with the degree-two or higher parity bit columns 702.

Thus, for a subsequent retransmission (e.g., RV1 or other RV), the information bits 804 and stored parity bits 816a may be input to the P-matrix rotation circuitry 806 to rotate those information bits 804 and stored parity bits 816a having corresponding entries in the rows within the P-matrix 808 associated with the degree-one parity bits to be generated for the RV. Again, using the example shown in FIG. 7, RV1 may be generated by rotating the bits (information or parity) associated with the columns having entries within the rows indicated on the left side of the P-matrix 700 for RV1 to generate the degree-one parity bits indicated on the top of the P-matrix 700 for RV1. In this example, the resulting second set of parity bits output from the parity bit calculation circuitry 814 for RV1 may include a subset of the initial set of parity bits 816, excluding the portion of the initial parity bits 816a selected for storage. Thus, the second set of parity bits generated for RV1 may include different bits than the stored parity bits 816a. In other examples, the second set of parity bits generated for RV1 does not include any of the initial set of parity bits 816. In this example, there is no overlap between the initial set of parity bits 816 and the second set of parity bits.

In some examples, the selected portion of the initial parity bits 816a may be stored within the HARQ buffer 822. In this example, parity bit information 826 including an identifier of the stored parity bits 816a generated for the initial redundancy version 820 may be stored within the memory 810 to provide a mapping between the information bits 804 and the corresponding stored parity bits 816a. Thus, for a subsequent redundancy version, the parity bit information 826 may be utilized to retrieve the information bits 804 and the stored parity bits 816a corresponding to the information bits 804 from the HARQ buffer 822 and input the information bits 804 and stored parity bits 816a to the P-matrix rotation circuitry 806.

In other examples, the selected portion of the initial parity bits 816a may be stored within an Open Systems Interconnection (OSI) Layer 2 (L2) or other upper layer buffer (not shown). For example, since L2 manages the systematic (information) bits for different transmissions, L2 may also be easily configured to maintain the stored parity bits 816a until an ACK is received or the maximum number of retransmissions has been met. For each retransmission, the stored parity bits 816*a* may then be fed back to the LDPC encoding circuitry 800 via a bus (not shown).

If the stored parity bits 816*a* are maintained within the HARQ buffer 822, a discard message may be provided to the LDPC encoding circuitry 800 to discard the stored parity bits 816*a* in the HARQ buffer 822 when an ACK is received or the maximum number of retransmissions occurs. In some examples, the LDPC encoding circuitry 800 may utilize the parity bit information 826 to locate and discard the stored parity bits 816*a* upon receiving the discard message. In some examples, the discard message may be received from an L2 or other upper layer buffer.

Figure 9:
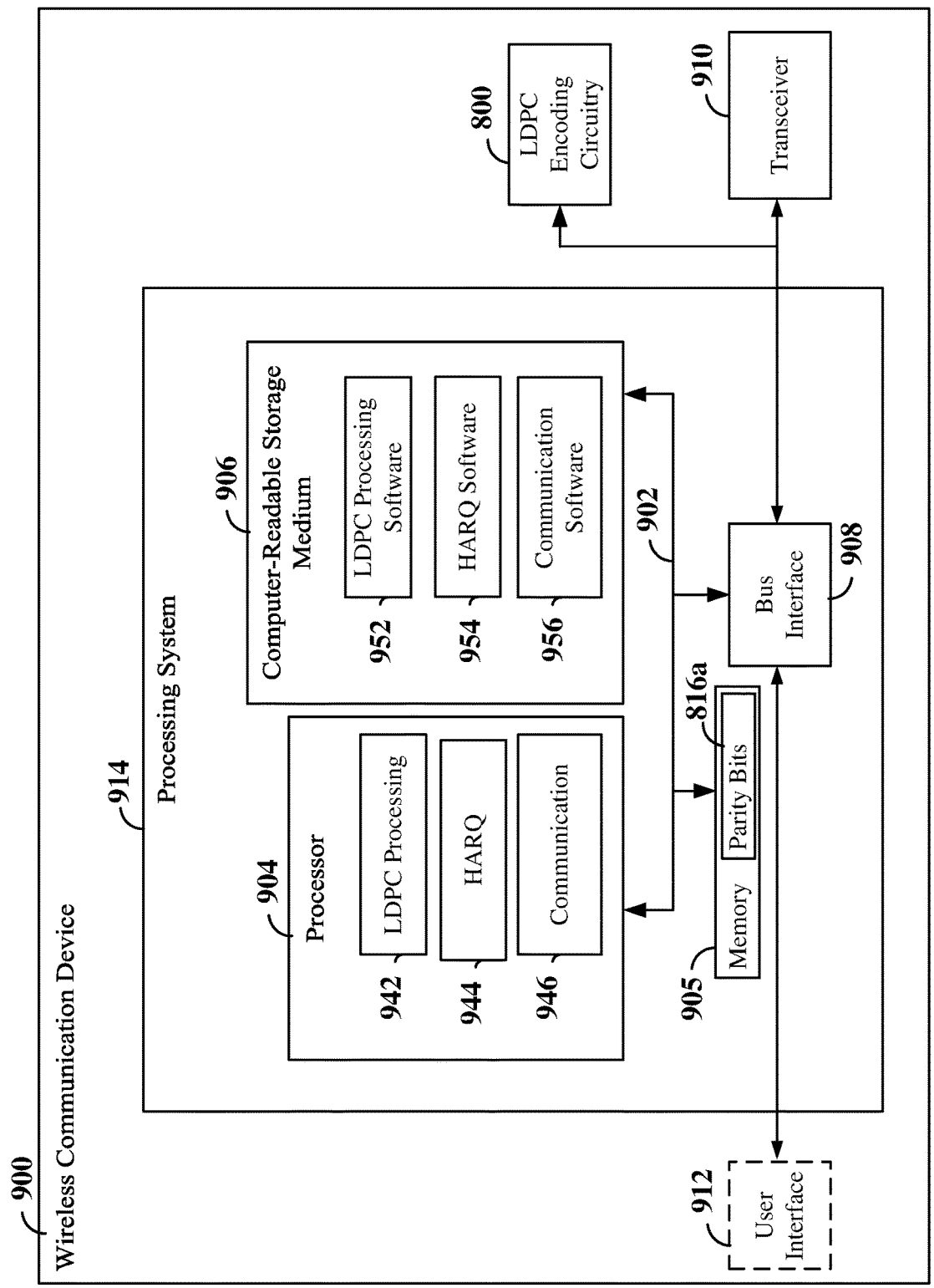
FIG. 9 is a block diagram illustrating an example of a hardware implementation for a wireless communication device employing a processing system according to some aspects of the present disclosure.

FIG. 9 is a conceptual diagram illustrating an example of a hardware implementation for an exemplary wireless communication device 900 employing a processing system 914. For example, the wireless communication device 900 may be a user equipment (UE), a base station, or any other suitable apparatus or means for wireless communication.

The wireless communication device 900 may be implemented with a processing system 914 that includes one or more processors 904. Examples of processors 904 include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. In various examples, the wireless communication device 900 may be configured to perform any one or more of the functions described herein. That is, the processor 904, as utilized in a wireless communication device 900, may be used to implement any one or more of the processes described and illustrated in FIGS. 10-12.

The processor 904 may in some instances be implemented via a baseband or modem chip and in other implementations, the processor 904 may itself comprise a number of devices distinct and different from a baseband or modem chip (e.g., in such scenarios is may work in concert to achieve embodiments discussed herein). And as mentioned above various hardware arrangements and components outside of a baseband modem processor can be used in implementations, including RF-chains, power amplifiers, modulators, buffers, interleavers, adders/summers, etc.

In this example, the processing system 914 may be implemented with a bus architecture, represented generally by the bus 902. The bus 902 may include any number of interconnecting buses and bridges depending on the specific application of the processing system 914 and the overall design constraints. The bus 902 communicatively couples together various circuits including one or more processors (represented generally by the processor 904), a memory 905, and computer-readable media (represented generally by the computer-readable medium 906). The bus 902 may also link various other circuits such as timing sources, peripherals, voltage regulators, and power management circuits, which are well known in the art, and therefore, will not be described any further. A bus interface 908 provides an interface between the bus 902 and a transceiver 910. The transceiver 910 provides a means for communicating with various other apparatus over a transmission medium (e.g., air). Depending upon the nature of the apparatus, an optional user interface 912 (e.g., keypad, display, speaker, microphone, joystick) may also be provided. It should be understood that the user interface 912 may not be provided in some devices, such as a base station.

The processor 904 is responsible for managing the bus 902 and general processing, including the execution of software stored on the computer-readable medium 906. The software, when executed by the processor 904, causes the processing system 914 to perform the various functions described below for any particular apparatus. The computer-readable medium 906 and the memory 905 may also be used for storing data that is manipulated by the processor 904 when executing software.

One or more processors 904 in the processing system may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise. The software may reside on a computer-readable medium 906. The computer-readable medium 906 may be a non-transitory computer-readable medium. A non-transitory computer-readable medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a computer. The computer-readable medium may also include, by way of example, a carrier wave, a transmission line, and any other suitable medium for transmitting software and/or instructions that may be accessed and read by a computer.

The computer-readable medium 906 may reside in the processing system 914, external to the processing system 914, or distributed across multiple entities including the processing system 914. The computer-readable medium 906 may be embodied in a computer program product. By way of example, a computer program product may include a computer-readable medium in packaging materials. Those skilled in the art will recognize how best to implement the described functionality presented throughout this disclosure depending on the particular application and the overall design constraints imposed on the overall system.

In some aspects of the disclosure, the processor 904 may include circuitry configured for various functions. For example, the processor 904 may include low-density parity check (LDPC) processing circuitry 942 configured to perform LDPC encoding and/or LDPC decoding. In some examples, the LDPC processing circuitry 942 may be configured to receive an information block including a plurality of information (systematic) bits and may be configured to encode the information block using the LDPC encoding circuitry 800 based on a particular code rate. In some examples, the LDPC processing circuitry 942 may be configured to select an LDPC base graph and identify the associated parity-check matrix (P-matrix). Examples of P-matrices that may be utilized in some examples are shown in FIGS. 6 and 7. The LDPC processing circuitry 942 may then provide instructions to the LDPC encoding circuitry 800 to encode the information block utilizing the selected P-matrix and to produce an encoded packet (codeword) for transmission over a wireless air interface to a receiving wireless communication device via the transceiver 910. The codeword contains the information bits of the information block and parity bits generated using the selected LDPC graph.

In various aspects of the present disclosure, the LDPC processing circuitry 942 may further be configured to store at least a portion of the initial parity bits 816a generated for the initial transmission within, for example, the memory 905. In some examples, the memory 905 may correspond to a HARQ buffer. In other examples, the memory 905 may correspond to an L2 or other upper layer buffer. The LDPC processing circuitry 942 may operate in coordination with LDPC processing software 952.

The processor 904 may further include HARQ circuitry 944 configured to receive feedback information (e.g., HARQ feedback information) from a receiving wireless communication device via the transceiver 910. In some examples, the HARQ feedback information includes acknowledgement information containing either an acknowledgement (ACK) or a negative acknowledgement (NACK) indicating whether the receiving wireless communication device was able to decode a transmitted encoded packet (codeword). Thus, based on the HARQ feedback information, the HARQ circuitry 944 may determine whether decoding of the encoded packet by the receiving wireless communication device has failed (e.g., by receiving a NACK from the receiving device via the transceiver 910). If the decoding failed, the HARQ circuitry 944 may be configured to execute a HARQ-IR algorithm to generate a retransmission of the encoded packet for transmission to the receiving device.

As indicated above, if the encoded packet that failed to be decoded was an initial transmission of the packet, the encoded packet may be referred to herein as an initial redundancy version (RV), commonly denoted RV0. If the encoded packet that failed to be decoded was a subsequent transmission of the packet, the encoded packet may be referred to herein as a subsequent RV. For example, the first retransmission may be denoted RV1, the second retransmission may be denoted RV2, and so on, up to RVN, which corresponds to the maximum number of retransmissions allowed before the packet is considered lost. Each redundancy version (RV0, RV1, . . . RVN) may include different encoded bits, comprised of systematic bits and/or parity bits.

Thus, the HARQ circuitry 944 may further be configured to operate in coordination with the LDPC processing circuitry 942 to generate a subsequent redundancy version (e.g., RV1, RV2, . . . RVN) of a packet upon receiving a NACK from the receiving wireless communication device indicating that decoding of the packet based on the previously transmitted redundancy version of the packet failed. For example, if the NACK is received in response to transmitting the initial redundancy version (RV0) of the packet, the HARQ circuitry 944 may operate in coordination with the LDPC processing circuitry 942 to generate the first retransmission (RV1) of the packet (or other redundancy version) and to transmit RV1 to the receiving wireless communication device via the transceiver 910. In various aspects of the disclosure, the LDPC processing circuitry 942 may access the memory 905 to retrieve the stored parity bits 816a and to provide the stored parity bits 816a to the LDPC encoding circuitry 800 to generate the subsequent redundancy version.

The processor 904 may further include communication circuitry 946. The communication circuitry 946 may include one or more hardware components that provide the physical structure that performs various processes related to wireless communication (e.g., signal reception and/or signal transmission) as described herein. For example, the communication circuitry 946 may be configured to transmit and/or receive a codeword encoded utilizing LDPC coding. The communication circuitry 946 may operate in coordination with communication software 956.

The circuitry included in the processor 904 is provided as non-limiting examples. Other means for carrying out the described functions exists and is included within various aspects of the present disclosure. In some aspects of the disclosure, the computer-readable medium 906 may store computer-executable code with instructions configured to perform various processes described herein. The instructions included in the computer-readable medium 906 are provided as non-limiting examples. Other instructions configured to carry out the described functions exist and are included within various aspects of the present disclosure.

Figure 10:
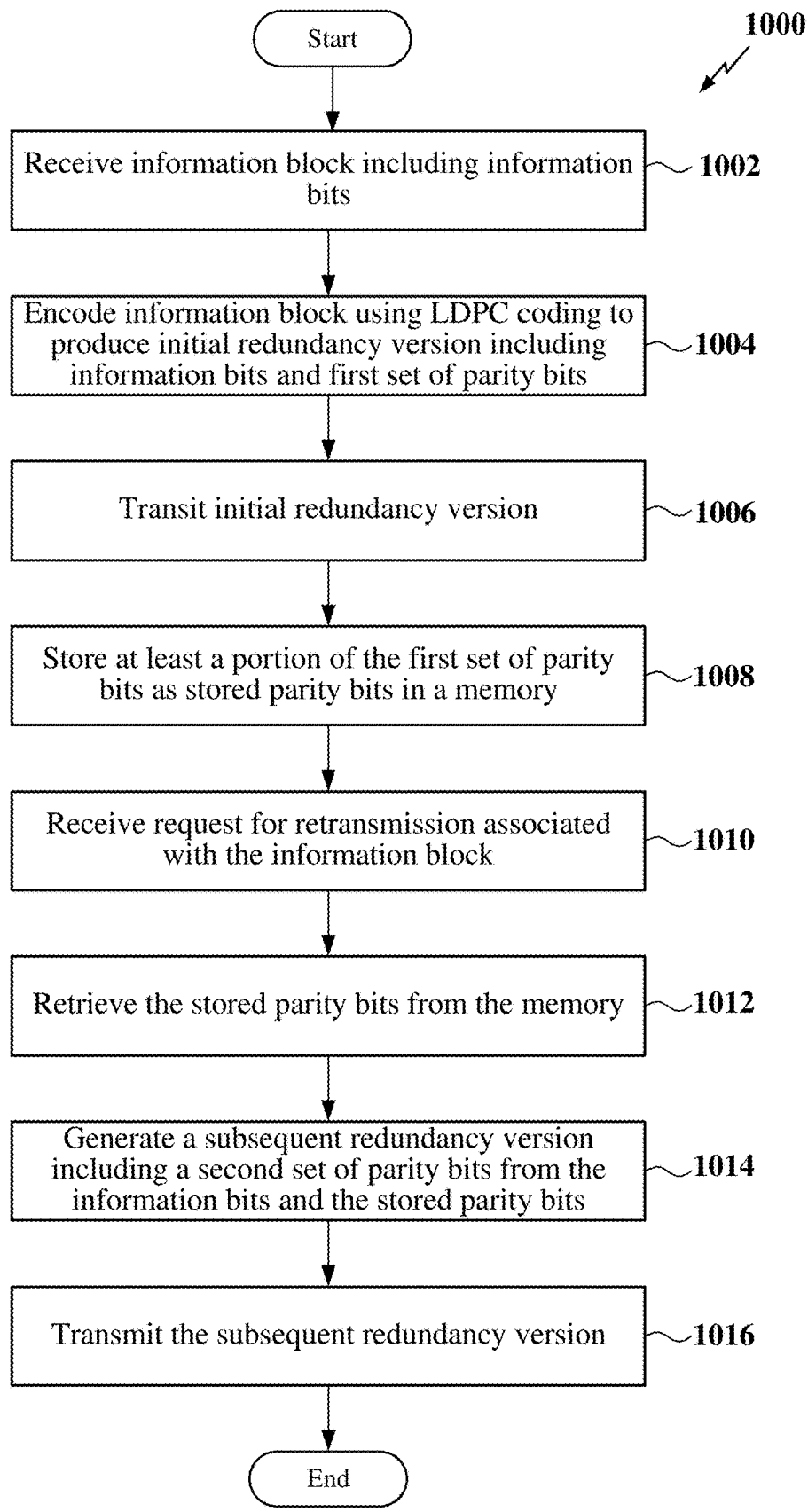
FIG. 10 is a flow chart of an exemplary method for LDPC encoding according to some aspects of the present disclosure.

FIG. 10 is a flow chart illustrating an exemplary process 1000 for low-density parity check (LDPC) encoding in accordance with some aspects of the present disclosure. As described below, some or all illustrated features may be omitted in a particular implementation within the scope of the present disclosure, and some illustrated features may not be required for implementation of all embodiments. In some examples, the process 1000 may be carried out by the wireless communication device illustrated in FIG. 9. In some examples, the process 1000 may be carried out by any suitable apparatus or means for carrying out the functions or algorithm described below.

At block 1002, the wireless communication device may receive an information block including information bits. At block 1004, the wireless communication device may encode the information block using low-density parity check (LDPC) coding to produce an initial redundancy version including the information bits and a first set of parity bits. For example, the LDPC processing circuitry 942 together with the LDPC encoding circuitry 800 shown and described above in reference to FIGS. 8 and 9 may encode the information block.

At block 1006, the wireless communication device may transmit the initial redundancy version. For example, the communication circuitry 946 and transceiver 910 shown and described above in reference to FIG. 9 may transmit the initial redundancy version to a receiving wireless communication device.

At block 1008, the wireless communication device may store at least a portion of the first set of parity bits as stored parity bits in a memory. In some examples, the stored parity bits may include the degree-two or higher parity bits in the initial redundancy version. In some examples, the memory may include a hybrid automatic repeat request (HARQ) buffer or a L2 or other upper layer buffer. For example, the LDPC processing circuitry 942 shown and described above in reference to FIG. 9 may store the stored parity bits within the memory 905.

At block 1010, the wireless communication device may receive a request for retransmission associated with the information block. For example, the HARQ circuitry 944 and transceiver 910 shown and described above in reference to FIG. 9 may receive the request for retransmission from the receiving wireless communication device. At block 1012, the wireless communication device may retrieve the stored parity bits from the memory. For example, the LDPC processing circuitry 942 shown and described above in reference to FIG. 9 may retrieve the stored parity bits from the memory and provide the stored parity bits to the LDPC encoding circuitry 800.

At block 1014, the wireless communication device may generate a subsequent redundancy version including a second set of parity bits from the information bits and the stored parity bits. The subsequent redundancy version may be, for example, RV1 or any combination of one or more RVs. In some examples, the second set of parity bits includes a subset of the first set of parity bits, along with additional degree-one parity bits generated based on the first set of parity bits. In some examples, the stored parity bits include different bits than the subset of the first set of parity bits such that there is no overlap between the stored parity bits and the subset of the first set of parity bits. In other examples, the second set of parity bits includes additional degree-one parity bits not included in the first set of parity bits such that there is no overlap between the first and second sets of parity bits. For example, the HARQ circuitry 944 and the LDPC processing circuitry 942 shown and described above in reference to FIG. 9 may instruct the LDPC encoding circuitry 800 to generate the subsequent redundancy version.

At block 1016, the wireless communication device may transmit the subsequent redundancy version. For example, the communication circuitry 946 and transceiver 910 shown and described above in reference to FIG. 9 may transmit the subsequent redundancy version to the receiving wireless communication device.

Figure 11:
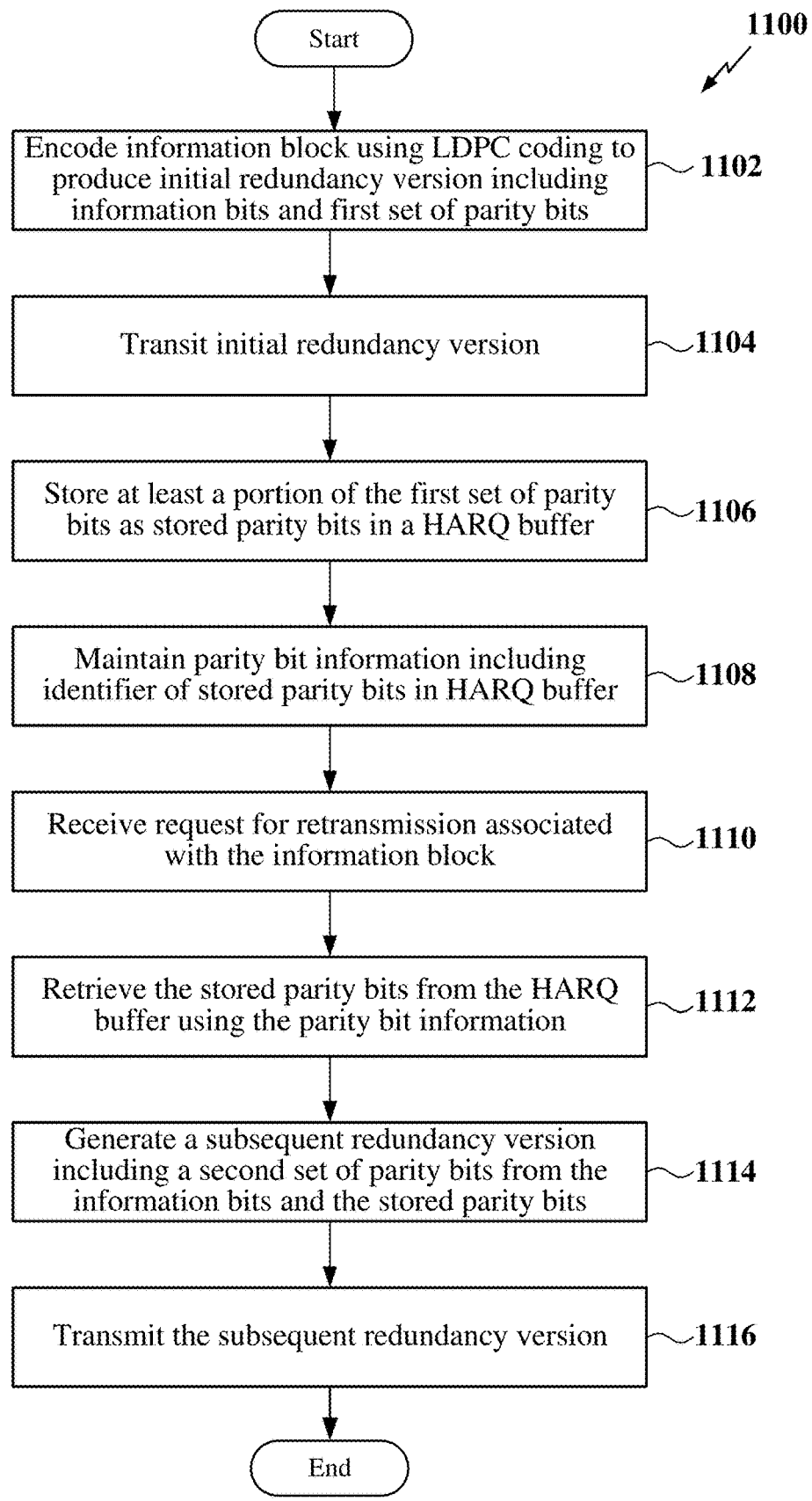
FIG. 11 is a flow chart of an exemplary method for LDPC encoding according to some aspects of the present disclosure.

FIG. 11 is a flow chart illustrating an exemplary process 1100 for low-density parity check (LDPC) encoding in accordance with some aspects of the present disclosure. As described below, some or all illustrated features may be omitted in a particular implementation within the scope of the present disclosure, and some illustrated features may not be required for implementation of all embodiments. In some examples, the process 1100 may be carried out by the wireless communication device illustrated in FIG. 9. In some examples, the process 1100 may be carried out by any suitable apparatus or means for carrying out the functions or algorithm described below.

At block 1102, the wireless communication device may encode an information block including information bits using low-density parity check (LDPC) coding to produce an initial redundancy version including the information bits and a first set of parity bits. For example, the LDPC processing circuitry 942 together with the LDPC encoding circuitry 800 shown and described above in reference to FIGS. 8 and 9 may encode the information block.

At block 1104, the wireless communication device may transmit the initial redundancy version. For example, the communication circuitry 946 and transceiver 910 shown and described above in reference to FIG. 9 may transmit the initial redundancy version to a receiving wireless communication device.

At block 1106, the wireless communication device may store at least a portion of the first set of parity bits as stored parity bits in a hybrid automatic repeat request (HARQ) buffer. In some examples, the stored parity bits may include the degree-two or higher parity bits in the initial redundancy version. For example, the LDPC processing circuitry 942 shown and described above in reference to FIG. 9 may store the stored parity bits within the HARQ buffer.

At block 1108, the wireless communication device maintain parity bit information including an identifier of the stored parity bits in the HARQ buffer. In some examples, the parity bit information provides a mapping between the information bits and the corresponding stored parity bits for subsequent redundancy versions. For example, the LDPC processing circuitry 942 shown and described above in reference to FIG. 9 may generate and store the parity bit information.

At block 1110, the wireless communication device may receive a request for retransmission associated with the information block. For example, the HARQ circuitry 944 and transceiver 910 shown and described above in reference to FIG. 9 may receive the request for retransmission from the receiving wireless communication device. At block 1112, the wireless communication device may retrieve the stored parity bits from the HARQ buffer using the parity bit information. For example, the LDPC processing circuitry 942 shown and described above in reference to FIG. 9 may retrieve the stored parity bits from the HARQ buffer and provide the stored parity bits to the LDPC encoding circuitry 800.

At block 1114, the wireless communication device may generate a subsequent redundancy version including a second set of parity bits from the information bits and the stored parity bits. The subsequent redundancy version may be, for example, RV1 or any combination of one or more RVs. In some examples, the second set of parity bits includes a subset of the first set of parity bits, along with additional degree-one parity bits generated based on the first set of parity bits. In some examples, the stored parity bits include different bits than the subset of the first set of parity bits such that there is no overlap between the stored parity bits and the subset of the first set of parity bits. In other examples, the second set of parity bits includes additional degree-one parity bits not included in the first set of parity bits such that there is no overlap between the first and second sets of parity bits. For example, the HARQ circuitry 944 and the LDPC processing circuitry 942 shown and described above in reference to FIG. 9 may instruct the LDPC encoding circuitry 800 to generate the subsequent redundancy version.

At block 1116, the wireless communication device may transmit the subsequent redundancy version. For example, the communication circuitry 946 and transceiver 910 shown and described above in reference to FIG. 9 may transmit the subsequent redundancy version to the receiving wireless communication device.

Figure 12:
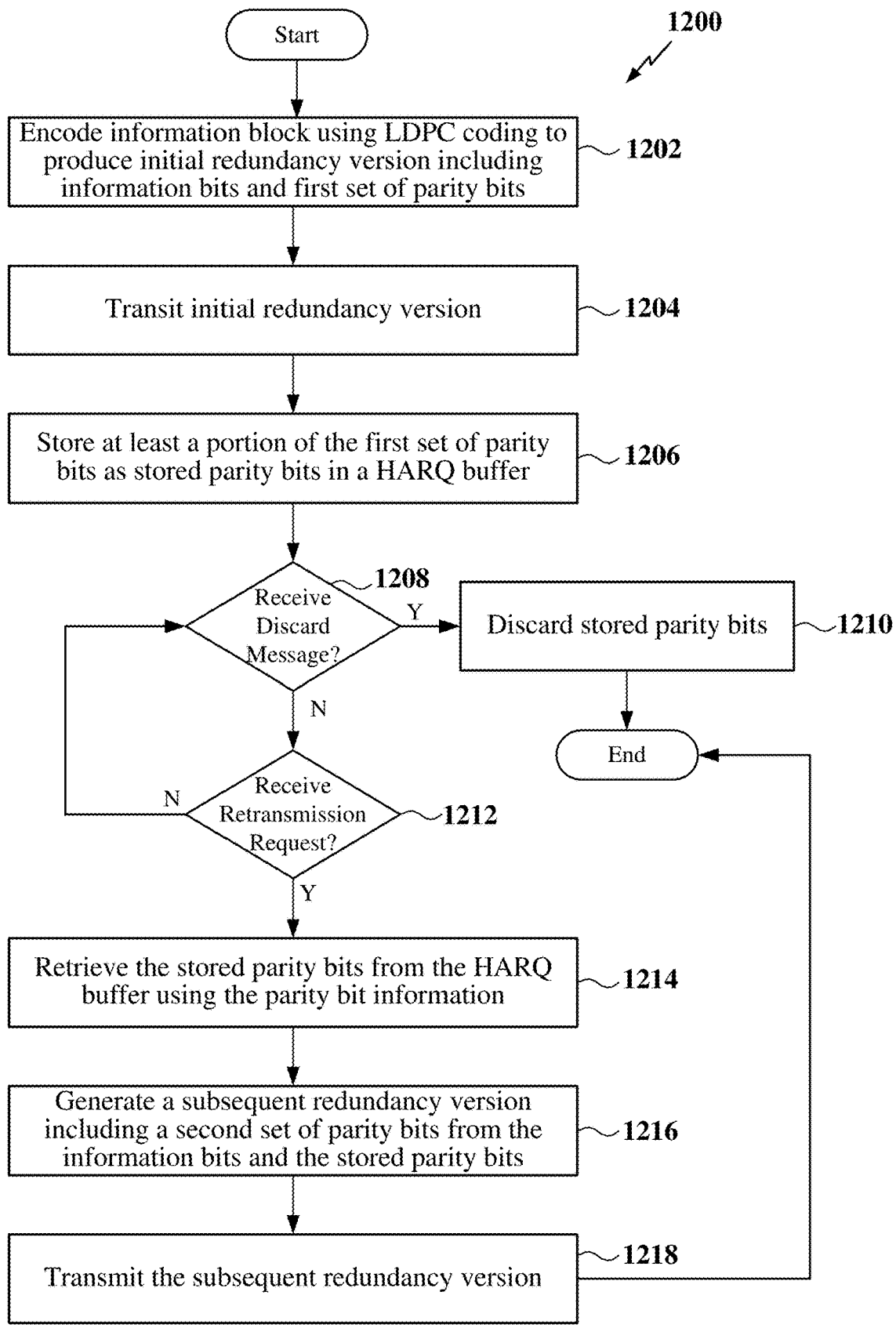
FIG. 12 is a flow chart of an exemplary method for LDPC encoding according to some aspects of the present disclosure.

FIG. 12 is a flow chart illustrating an exemplary process 1200 for low-density parity check (LDPC) encoding in accordance with some aspects of the present disclosure. As described below, some or all illustrated features may be omitted in a particular implementation within the scope of the present disclosure, and some illustrated features may not be required for implementation of all embodiments. In some examples, the process 1200 may be carried out by the wireless communication device illustrated in FIG. 9. In some examples, the process 1200 may be carried out by any suitable apparatus or means for carrying out the functions or algorithm described below.

At block 1202, the wireless communication device may encode an information block including information bits using low-density parity check (LDPC) coding to produce an initial redundancy version including the information bits and a first set of parity bits. For example, the LDPC processing circuitry 942 together with the LDPC encoding circuitry 800 shown and described above in reference to FIGS. 8 and 9 may encode the information block.

At block 1204, the wireless communication device may transmit the initial redundancy version. For example, the communication circuitry 946 and transceiver 910 shown and described above in reference to FIG. 9 may transmit the initial redundancy version to a receiving wireless communication device.

At block 1206, the wireless communication device may store at least a portion of the first set of parity bits as stored parity bits in a hybrid automatic repeat request (HARQ) buffer. In some examples, the stored parity bits may include the degree-two or higher parity bits in the initial redundancy version. For example, the LDPC processing circuitry 942 shown and described above in reference to FIG. 9 may store the stored parity bits within the HARQ buffer.

At block 1208, the wireless communication device determine whether a discard message for the stored parity bits has been received. If a discard message has been received (Y branch of block 1208), at block 1210, the wireless communication device may discard the stored parity bits from the HARQ buffer. For example, the LDPC processing circuitry 942 and HARQ circuitry 944 shown and described above in reference to FIG. 9 may receive the discard message and discard the stored parity bits.

If a discard message has not been received (N branch of block 1208), at block 1212, the wireless communication device may determine whether a retransmission request has been received. If a retransmission request has not been received (N branch of block 1212), the process returns to block 1208, where the wireless communication device determines whether a discard message has been received. For example, the LDPC processing circuitry 924 and HARQ circuitry 944 shown and described above in reference to FIG. 9 may determine whether a retransmission request has been received.

If a retransmission request has been received (Y branch of block 1212), at block 1214, the wireless communication device may retrieve the stored parity bits from the HARQ buffer. For example, the LDPC processing circuitry 942 shown and described above in reference to FIG. 9 may retrieve the stored parity bits from the HARQ buffer and provide the stored parity bits to the LDPC encoding circuitry 800.

At block 1216, the wireless communication device may generate a subsequent redundancy version including a second set of parity bits from the information bits and the stored parity bits. The subsequent redundancy version may be, for example, RV1 or any combination of one or more RVs. In some examples, the second set of parity bits includes a subset of the first set of parity bits, along with additional degree-one parity bits generated based on the first set of parity bits. In some examples, the stored parity bits include different bits than the subset of the first set of parity bits such that there is no overlap between the stored parity bits and the subset of the first set of parity bits. In other examples, the second set of parity bits includes additional degree-one parity bits not included in the first set of parity bits such that there is no overlap between the first and second sets of parity bits. For example, the HARQ circuitry 944 and the LDPC processing circuitry 942 shown and described above in reference to FIG. 9 may instruct the LDPC encoding circuitry 800 to generate the subsequent redundancy version.

At block 1218, the wireless communication device may transmit the subsequent redundancy version. For example, the communication circuitry 946 and transceiver 910 shown and described above in reference to FIG. 9 may transmit the subsequent redundancy version to the receiving wireless communication device.

In one configuration, a wireless communication device (e.g., the wireless communication device 900 shown in FIG. 9) configured for low-density parity check (LDPC) encoding includes means for receiving an information block including information bits, means for encoding the information block using low-density parity check (LDPC) coding to produce an initial redundancy version including the information bits and a first set of parity bits, means for transmitting the initial redundancy version, and means for storing at least a portion of the first set of parity bits as stored parity bits in a memory. The wireless communication device further includes means for receiving a request for retransmission associated with the information block, means for retrieving the stored parity bits from the memory, means for generating a subsequent redundancy version from the information bits and the stored parity bits, where the subsequent redundancy version includes a second set of parity bits, and means for transmitting the subsequent redundancy version.

In one aspect, the aforementioned means may be the processor(s) 904 and LDPC encoding circuitry 800 shown in FIG. 9 configured to perform the functions recited by the aforementioned means. For example, the aforementioned means may include the LDPC processing circuitry 942, HARQ circuitry 944, and LDPC encoding circuitry 800 shown in FIG. 9. In still another aspect, the aforementioned means may be a circuit or any apparatus configured to perform the functions recited by the aforementioned means.

Several aspects of a wireless communication network have been presented with reference to an exemplary implementation. As those skilled in the art will readily appreciate, various aspects described throughout this disclosure may be extended to other telecommunication systems, network architectures and communication standards.

By way of example, various aspects may be implemented within other systems defined by 3GPP, such as Long-Term Evolution (LTE), the Evolved Packet System (EPS), the Universal Mobile Telecommunication System (UMTS), and/or the Global System for Mobile (GSM). Various aspects may also be extended to systems defined by the 3rd Generation Partnership Project 2 (3GPP2), such as CDMA2000 and/or Evolution-Data Optimized (EV-DO). Other examples may be implemented within systems employing IEEE 802.11 (Wi-Fi), IEEE 802.16 (WiMAX), IEEE 802.20, Ultra-Wideband (UWB), Bluetooth, and/or other suitable systems. The actual telecommunication standard, network architecture, and/or communication standard employed will depend on the specific application and the overall design constraints imposed on the system.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. For instance, a first object may be coupled to a second object even though the first object is never directly physically in contact with the second object. The terms "circuit" and "circuitry" are used broadly, and intended to include both hardware implementations of electrical devices and conductors that, when connected and configured, enable the performance of the functions described in the present disclosure, without limitation as to the type of electronic circuits, as well as software implementations of information and instructions that, when executed by a processor, enable the performance of the functions described in the present disclosure.

One or more of the components, steps, features and/or functions illustrated in FIGS. 1-12 may be rearranged and/or combined into a single component, step, feature or function or embodied in several components, steps, or functions. Additional elements, components, steps, and/or functions may also be added without departing from novel features disclosed herein. The apparatus, devices, and/or components illustrated in FIGS. 1, 2, 8, and/or 9 may be configured to perform one or more of the methods, features, or steps described herein. The novel algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

What is claimed is:

1. A method of low-density parity check (LDPC) encoding, the method comprising:
   receiving an information block comprising information bits;
   encoding the information block using low-density parity check (LDPC) coding to produce an initial redundancy version comprising the information bits and a first set of parity bits;
   transmitting the initial redundancy version;
   storing at least a portion of the first set of parity bits as stored parity bits in a memory;
   receiving a request for retransmission associated with the information block;
   retrieving the stored parity bits from the memory;
   generating a subsequent redundancy version from the information bits and the stored parity bits, wherein the subsequent redundancy version comprises a second set of parity bits; and
   transmitting the subsequent redundancy version.

2. The method of claim 1, wherein the first set of parity bits comprises degree-two parity bits, and wherein storing at least the portion of the first set of parity bits as the stored parity bits further comprises:
   storing the degree-two parity bits in the first set of parity bits as the stored parity bits.

3. The method of claim 2, wherein the first set of parity bits further comprises at least one degree-three parity bit, and wherein storing at least the portion of the first set of parity bits as the stored parity bits further comprises:
   storing the degree-two parity bits and the at least one degree-three parity bit in the first set of parity bits as the stored parity bits.

4. The method of claim 1, wherein the second set of parity bits comprises a subset of the first set of parity bits, wherein the subset of the first set of parity bits comprises degree-one parity bits.

5. The method of claim 4, wherein the second set of parity bits comprises additional degree-one parity bits generated based on the first set of parity bits.

6. The method of claim 1, wherein the second set of parity bits comprises additional degree-one parity bits generated based on the first set of parity bits.

7. The method of claim 1, wherein storing at least the portion of the first set of parity bits as the stored parity bits in the memory further comprises:
   storing the stored parity bits within a hybrid automatic repeat request (HARQ) buffer.

8. The method of claim 7, wherein retrieving the stored parity bits from the memory further comprises:
   maintaining parity bit information comprising an identifier of the stored parity bits for the information block in the HARQ buffer; and
   retrieving the stored parity bits from the HARQ buffer utilizing the parity bit information.

9. The method of claim 8, further comprising:
   receiving a discard message; and
   discarding the stored parity bits in the HARQ buffer utilizing the parity bit information.

10. The method of claim 1, wherein storing at least the portion of the first set of parity bits as the stored parity bits in the memory further comprises:
    storing the stored parity bits within an upper layer buffer.

11. An apparatus configured for low-density parity check (LDPC) coding, comprising:
    a memory;
    a transceiver; and
    a processor communicatively coupled to the memory and the transceiver, the processor configured to:
      receive an information block comprising information bits;
      encode the information block using low-density parity check (LDPC) coding to produce an initial redundancy version comprising the information bits and a first set of parity bits;
      transmit the initial redundancy version via the transceiver;
      store at least a portion of the first set of parity bits as stored parity bits in the memory;
      receive a request for retransmission associated with the information block;
      retrieve the stored parity bits from the memory;
      generate a subsequent redundancy version from the information bits and the stored parity bits, wherein the subsequent redundancy version comprises a second set of parity bits; and
      transmit the subsequent redundancy version via the transceiver.

12. The apparatus of claim 11, wherein the first set of parity bits comprises degree-two parity bits, and wherein the processor is further configured to:
    store the degree-two parity bits in the first set of parity bits as the stored parity bits.

13. The apparatus of claim 12, wherein the first set of parity bits further comprises at least one degree-three parity bit, and wherein the processor is further configured to:
 store the degree-two parity bits and the at least one degree-three parity bit in the first set of parity bits as the stored parity bits.

14. The apparatus of claim 11, wherein the second set of parity bits comprises at least additional degree-one parity bits generated based on the first set of parity bits.

15. The apparatus of claim 11, wherein the memory comprises a hybrid automatic repeat request (HARQ) buffer.

16. The apparatus of claim 15, wherein the processor is further configured to:
 maintain parity bit information comprising an identifier of the stored parity bits for the information block in the HARQ buffer; and
 retrieve the stored parity bits from the HARQ buffer utilizing the parity bit information.

17. The apparatus of claim 16, wherein the processor is further configured to:
 receive a discard message; and
 discard the stored parity bits in the HARQ buffer utilizing the parity bit information.

18. The apparatus of claim 1, wherein the memory comprises an upper layer buffer.

19. A wireless communication device configured for low-density parity check (LDPC) coding, comprising:
 means for receiving an information block comprising information bits;
 means for encoding the information block using low-density parity check (LDPC) coding to produce an initial redundancy version comprising the information bits and a first set of parity bits;
 means for transmitting the initial redundancy version;
 means for storing at least a portion of the first set of parity bits as stored parity bits in a memory;
 means for receiving a request for retransmission associated with the information block;
 means for retrieving the stored parity bits from the memory;
 means for generating a subsequent redundancy version from the information bits and the stored parity bits, wherein the subsequent redundancy version comprises a second set of parity bits; and
 means for transmitting the subsequent redundancy version.

20. The wireless communication device of claim 19, wherein the first set of parity bits comprises degree-two parity bits, and wherein the means for storing at least the portion of the first set of parity bits as the stored parity bits further comprises:
 means for storing the degree-two parity bits in the first set of parity bits as the stored parity bits.

21. The wireless communication device of claim 20, wherein the first set of parity bits further comprises at least one degree-three parity bit, and wherein the means for storing at least the portion of the first set of parity bits as the stored parity bits further comprises:
 means for storing the degree-two parity bits and the at least one degree-three parity bit in the first set of parity bits as the stored parity bits.

22. The wireless communication device of claim 19, wherein the second set of parity bits comprises at least additional degree-one parity bits generated based on the first set of parity bits.

23. The wireless communication device of claim 19, wherein the means for retrieving the stored parity bits from the memory further comprises:
 means for maintaining parity bit information comprising an identifier of the stored parity bits for the information block in the memory; and
 means for retrieving the stored parity bits from the memory utilizing the parity bit information.

24. The wireless communication device of claim 23, further comprising:
 means for receiving a discard message; and
 means for discarding the stored parity bits in the memory utilizing the parity bit information.

25. A non-transitory computer-readable medium storing computer executable code, comprising code for:
 receiving an information block comprising information bits;
 encoding the information block using low-density parity check (LDPC) coding to produce an initial redundancy version comprising the information bits and a first set of parity bits;
 transmitting the initial redundancy version;
 storing at least a portion of the first set of parity bits as stored parity bits in a memory;
 receiving a request for retransmission associated with the information block;
 retrieving the stored parity bits from the memory;
 generating a subsequent redundancy version from the information bits and the stored parity bits, wherein the subsequent redundancy version comprises a second set of parity bits; and
 transmitting the subsequent redundancy version.

26. The non-transitory computer-readable medium of claim 25, wherein the first set of parity bits comprises degree-two parity bits, and wherein the code for storing at least the portion of the first set of parity bits as the stored parity bits further comprises code for:
 storing the degree-two parity bits in the first set of parity bits as the stored parity bits.

27. The non-transitory computer-readable medium of claim 26, wherein the first set of parity bits further comprises at least one degree-three parity bit, and wherein the code for storing at least the portion of the first set of parity bits as the stored parity bits further comprises code for:
 storing the degree-two parity bits and the at least one degree-three parity bit in the first set of parity bits as the stored parity bits.

28. The non-transitory computer-readable medium of claim 25, wherein the second set of parity bits comprises at least additional degree-one parity bits generated based on the first set of parity bits.

29. The non-transitory computer-readable medium of claim 25, wherein the code for retrieving the stored parity bits from the memory further comprises code for:
 maintaining parity bit information comprising an identifier of the stored parity bits for the information block in the memory; and
 retrieving the stored parity bits from the memory utilizing the parity bit information.

30. The non-transitory computer-readable medium of claim 29, further comprising code for:
 receiving a discard message; and
 discarding the stored parity bits in the memory utilizing the parity bit information.

* * * * *